(12) United States Patent
Lee et al.

(10) Patent No.: US 12,056,952 B2
(45) Date of Patent: Aug. 6, 2024

(54) FINGERPRINT SENSOR AND DISPLAY DEVICE INCLUDING THE SAME

(71) Applicant: SAMSUNG DISPLAY CO., LTD., Yongin-si (KR)

(72) Inventors: Jeong Heon Lee, Yongin-si (KR); Young Sik Kim, Yongin-si (KR); Jung Hak Kim, Hwaseong-si (KR); Kyo Won Ku, Seoul (KR); Hee Yeon Choi, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/057,425

(22) Filed: Nov. 21, 2022

(65) Prior Publication Data

US 2023/0116395 A1   Apr. 13, 2023

Related U.S. Application Data

(63) Continuation of application No. 17/169,753, filed on Feb. 8, 2021, now Pat. No. 11,508,178.

(30) Foreign Application Priority Data

Apr. 28, 2020   (KR) .......................... 10-2020-0051751

(51) Int. Cl.
*H01L 31/0232*   (2014.01)
*G06V 40/13*   (2022.01)
(Continued)

(52) U.S. Cl.
CPC ........ *G06V 40/1318* (2022.01); *H01L 23/481* (2013.01); *H10K 59/12* (2023.02);
(Continued)

(58) Field of Classification Search
CPC .... G06V 40/1318; H10K 59/65; H10K 59/12; H01L 23/481; H01L 27/14623; H01L 27/14678
(Continued)

(56) References Cited

U.S. PATENT DOCUMENTS 10,665,631 B1 * 5/2020 Cai .................... H01L 27/14678
2012/0086094 A1 * 4/2012 Watanabe ............. H01L 23/481
257/E31.127
(Continued)

FOREIGN PATENT DOCUMENTS

| JP | 2004-356535 | 12/2004 |
|---|---|---|
| KR | 10-2043921 | 11/2019 |
| KR | 10-2020-0011689 | 2/2020 |

OTHER PUBLICATIONS

Extended European Search Report dated Sep. 24, 2021 in corresponding Application No. 21169071.4.
(Continued)

*Primary Examiner* — Abdul-Samad A Adediran
(74) *Attorney, Agent, or Firm* — F. Chau & Associates, LLC

(57) ABSTRACT

A fingerprint sensor includes a substrate, a sensor pixel disposed on the substrate and including a light sensing element through which a sensing current flows according to an amount of incident light, a light-blocking conductive layer disposed on the sensor pixel and including a plurality of holes, a first fingerprint pad disposed on the substrate, and a conductive connector connected to the first fingerprint pad and to which a predetermined voltage is applied. The light-blocking conductive layer is electrically connected to the conductive connector.

20 Claims, 22 Drawing Sheets

(51) Int. Cl.
    *H01L 23/48*     (2006.01)
    *H10K 59/12*     (2023.01)
    *H10K 59/65*     (2023.01)
    *H01L 27/146*     (2006.01)

(52) U.S. Cl.
    CPC ........ *H10K 59/65* (2023.02); *H01L 27/14623* (2013.01); *H01L 27/14678* (2013.01)

(58) Field of Classification Search
    USPC .................................................... 257/31.127
    See application file for complete search history.

(56) References Cited

U.S. PATENT DOCUMENTS

| | | | |
|---|---|---|---|
| 2017/0270342 A1 | 9/2017 | He et al. | |
| 2019/0103431 A1* | 4/2019 | Murata | H01L 27/14623 |
| 2019/0129541 A1 | 5/2019 | Kwon et al. | |
| 2021/0334502 A1 | 10/2021 | Lee et al. | |

OTHER PUBLICATIONS

Office Action dated Mar. 29, 2022 in corresponding U.S. Appl. No. 17/169,753.

\* cited by examiner

US 12,056,952 B2

FINGERPRINT SENSOR AND DISPLAY DEVICE INCLUDING THE SAME

CROSS-REFERENCE TO RELATED APPLICATIONS

This application is a continuation application of U.S. patent application Ser. No. 17/169,753 filed Feb. 8, 2021, which claims priority under 35 U.S.C. § 119 to Korean Patent Application No. 10-2020-0051751 filed on Apr. 28, 2020, the disclosures of which are incorporated by reference herein in their entirety.

TECHNICAL FIELD

Exemplary embodiments of the present inventive concept relate to a fingerprint sensor and a display device including the same.

DISCUSSION OF THE RELATED ART

Display devices are being applied to various electronic devices such as, for example, smartphones, tablets, notebook computers, monitors, televisions, etc. Recently, the development of mobile communication technology has greatly increased the use of portable electronic devices such as smartphones, tablets, and notebook computers. A portable electronic device often stores private information such as, for example, contact information, call history, messages, photographs, memos, web browsing history, location information, financial information, etc. In this case, fingerprint authentication may be used to authenticate a fingerprint, which is a user's biometric information, to protect private information stored on a portable electronic device. In this case, a display device may include a fingerprint sensor for fingerprint authentication.

A fingerprint sensor may be implemented as, for example, an optical, ultrasonic, or capacitive fingerprint sensor. An optical fingerprint sensor may include a light sensing layer which includes a light sensing element for sensing light and an optical layer which provides light by reducing noise light in the light sensing element.

SUMMARY

Exemplary embodiments of the present inventive concept provide a fingerprint sensor which can prevent or reduce noise due to signals of a display panel from adversely affecting sensing signals of the fingerprint sensor.

Exemplary embodiments of the present inventive concept provide a display device which can prevent or reduce noise due to signals of a display panel from adversely affecting sensing signals of a fingerprint sensor.

According to an exemplary embodiment of the present inventive concept, a fingerprint sensor includes a substrate, a sensor pixel disposed on the substrate and including a light sensing element through which a sensing current flows according to an amount of incident light, a light-blocking conductive layer disposed on the sensor pixel and including a plurality of holes, a first fingerprint pad disposed on the substrate, and a conductive connector connected to the first fingerprint pad and to which a predetermined voltage is applied. The light-blocking conductive layer is electrically connected to the conductive connector.

According to an exemplary embodiment of the present inventive concept, a fingerprint sensor includes a substrate, a sensor pixel disposed on the substrate and including a light sensing element through which a sensing current flows according to an amount of incident light, a light-blocking conductive layer disposed on the sensor pixel and including a plurality of holes, a fingerprint pad disposed on the substrate, a flexible film disposed on the fingerprint pad, and a sensor circuit board electrically connected to the flexible film. The flexible film or the sensor circuit board includes a conductive connector to which a predetermined voltage is applied, and the light-blocking conductive layer is electrically connected to the conductive connector.

According to an exemplary embodiment of the present inventive concept, a display device includes a display panel which displays an image, and a fingerprint sensor which is disposed on a surface of the display panel and senses a light passing through the display panel. The fingerprint sensor includes a substrate, a sensor pixel disposed on the substrate and including a light sensing element through which a sensing current flows according to an amount of incident light, a light-blocking conductive layer disposed on the sensor pixel and including a plurality of holes, a fingerprint pad disposed on the substrate, and a conductive connector connected to the fingerprint pad and to which a predetermined voltage is applied. The light-blocking conductive layer is electrically connected to the conductive connector.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION

Figure 1:
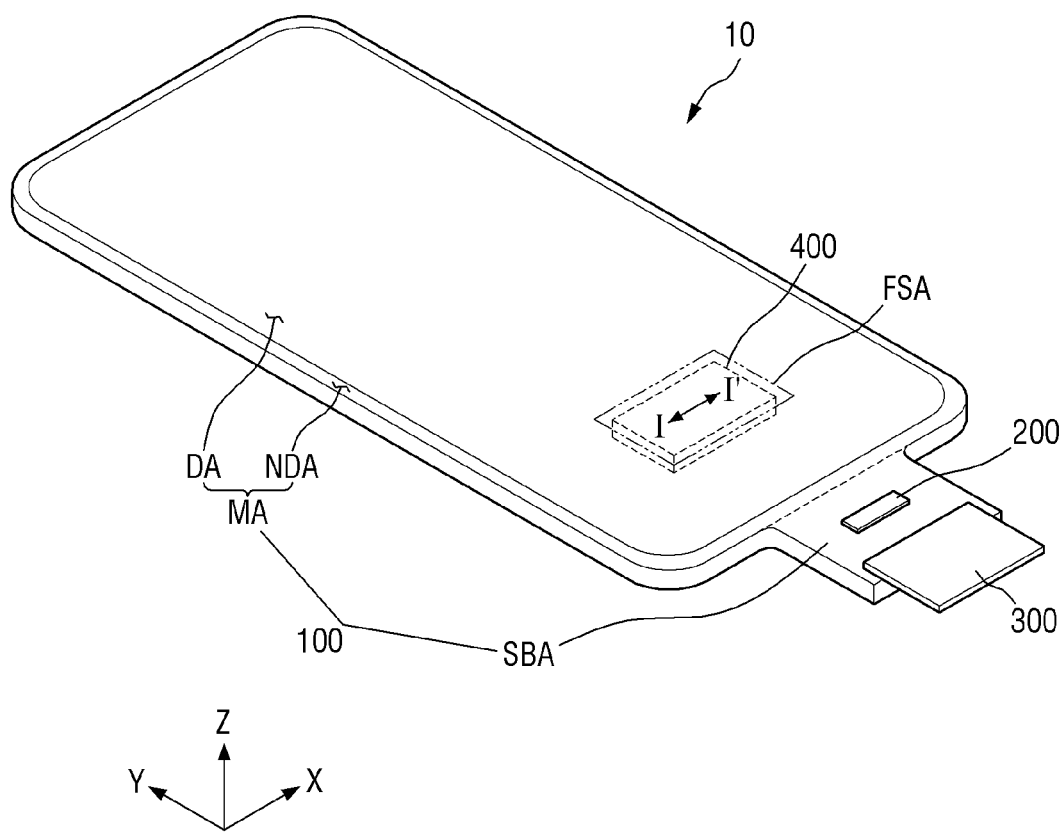
FIG. 1 is a perspective view of a display device according to an exemplary embodiment.

Exemplary embodiments of the present inventive concept will be described more fully hereinafter with reference to the accompanying drawings. Like reference numerals may refer to like elements throughout the accompanying drawings.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words use to describe the relationship between elements may be interpreted in a like fashion.

It will be further understood that descriptions of features or aspects within each exemplary embodiment are available for other similar features or aspects in other exemplary embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

FIG. 1 is a perspective view of a display device 10 according to an exemplary embodiment.

Referring to FIG. 1, the display device 10 is a device for displaying moving images, such as video, or still images. The display device 10 may be used as a display screen in portable electronic devices such as, for example, mobile phones, smartphones, tablet personal computers (PCs), smartwatches, watch phones, mobile communication terminals, electronic notebooks, electronic books, portable multimedia players (PMPs), navigation devices and ultra-mobile PCs (UMPCs), etc., as well as in various other products such as, for example, televisions, notebook computers, monitors, billboards and the Internet of Things (IoT) devices.

The display device 10 may be an organic light emitting display device using organic light emitting diodes, a quantum dot light emitting display device including quantum dot light emitting layers, an inorganic light emitting display device including inorganic semiconductors, or a micro light emitting diode display device using micro light emitting diodes. Although a case in which the display device 10 is an organic light emitting display device is mainly described below, the present inventive concept is not limited thereto.

The display device 10 includes a display panel 100, a display driving circuit 200, a display circuit board 300, and a fingerprint sensor 400.

The shape of the display panel 100 may include, for example, a rectangular plane having short sides in a first direction (X-axis direction) and long sides (e.g., relatively longer than the short sides) in a second direction (Y-axis direction) intersecting the first direction (X-axis direction). Each corner where a short side extending in the first direction (X-axis direction) meets a long side extending in the second direction (Y-axis direction) may be rounded to have a predetermined curvature or may be right-angled. The planar shape of the display device 10 is not limited to the rectangular shape, but may also be another polygonal shape, a circular shape, or an oval shape. The display panel 100 may be formed flat, but the present inventive concept is not limited thereto. For example, the display panel 100 may include a curved part which is formed at left and right ends and has a constant or varying curvature. In addition, the display panel 100 may be formed flexibly so that it can be curved, bent, folded, or rolled. Thus, the display panel 100 may also be referred to as a bendable, foldable, or rollable display panel.

The display panel 100 may include a main area MA and a subarea SBA.

The main area MA may include a display area DA in which an image is displayed, and a non-display area NDA located around the display area DA. The display area DA may include display pixels that display an image. The non-display area NDA may be defined as an area extending from the outside of the display area DA to edges of the display panel 100. The non-display area NDA is an area in which an image is not displayed. The non-display area NDA may surround the display area DA.

The display area DA may include a fingerprint sensing area FSA. The fingerprint sensing area FSA indicates an area where the fingerprint sensor 400 is disposed. The fingerprint sensing area FSA may be a part of the display area DA as illustrated in FIG. 1, but the present inventive concept is not limited thereto. The fingerprint sensing area FSA may also be the entire display area DA. For example, the area occupied by the fingerprint sensing area FSA may be substantially the same as the area occupied by the display area DA.

The subarea SBA may protrude from a side of the main area MA in the second direction (Y-axis direction). A length of the subarea SBA in the first direction (X-axis direction) may be smaller than a length of the main area MA in the first direction (X-axis direction), and a length of the subarea SBA in the second direction (Y-axis direction) may be smaller than a length of the main area MA in the second direction (Y-axis direction), but the present inventive concept is not limited thereto.

Although the subarea SBA is unfolded in FIG. 1, it may also be bent, in which case the subarea SBA may be disposed on a lower surface of the display panel 100. When the subarea SBA is bent, it may overlap the main area MA in a thickness direction (Z-axis direction). The display driving circuit 200 may be disposed in the subarea SBA.

The display driving circuit 200 may generate signals and voltages for driving the display panel 100. The display driving circuit 200 may be formed as an integrated circuit and attached onto the display panel 100 using, for example, a chip-on-glass (COG) method, a chip-on-plastic (COP) method, or an ultrasonic bonding method. However, the present inventive concept is not limited thereto. For example, according to exemplary embodiments, the display driving circuit 200 may also be attached onto the display circuit board 300 using a chip-on-film (COF) method.

The display circuit board 300 may be attached to an end of the subarea SBA of the display panel 100 using a conductive adhesive member such as, for example, an anisotropic conductive film. Therefore, the display circuit board 300 may be electrically connected to the display panel 100 and the display driving circuit 200. The display panel 100 and the display driving circuit 200 may receive digital video data, timing signals, and driving voltages through the display circuit board 300. The display circuit board 300 may be, for example, a flexible printed circuit board, a printed circuit board, or a flexible film such as a chip-on-film.

The fingerprint sensor 400 may be disposed on the lower surface of the display panel 100. The fingerprint sensor 400 may be attached to the lower surface of the display panel 100 using a transparent adhesive member. For example, the transparent adhesive member may be a transparent adhesive film such as an optically clear adhesive (OCA) film or a transparent adhesive resin such as an optically clear resin (OCR).

Figure 2:
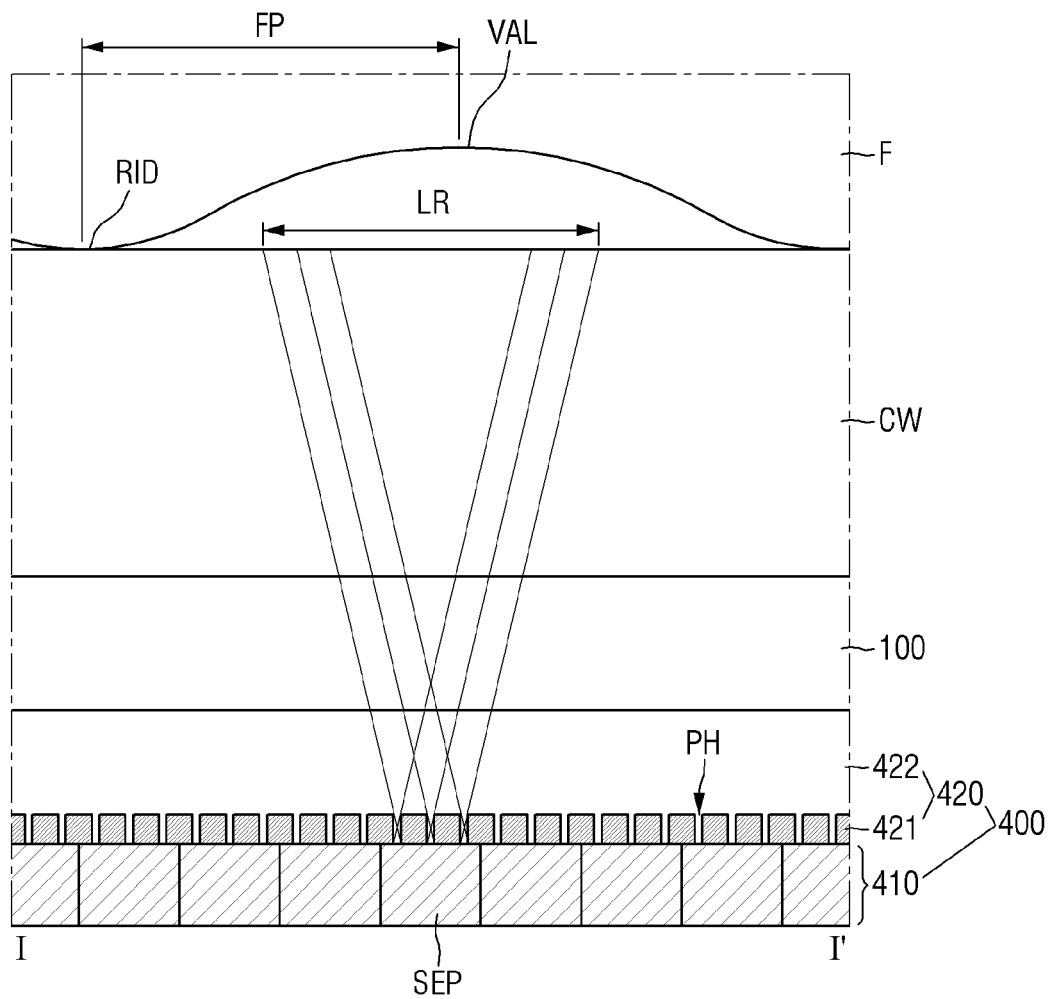
FIG. 2 is a cross-sectional view of an example of a display panel and a fingerprint sensor taken along line I-I' of FIG. 1.

FIG. 2 is a cross-sectional view of an example of the display panel 100 and the fingerprint sensor 400 taken along line I-I' of FIG. 1. In FIG. 2, a case in which a user places a finger F on a cover window CW of the display device 10 for fingerprint recognition is illustrated.

Referring to FIG. 2, the display device 10 further includes the cover window CW disposed on an upper surface of the display panel 100. The cover window CW may be disposed on the display panel 100 to cover the upper surface of the display panel 100. The cover window CW may serve to protect the upper surface of the display panel 100. The cover window CW may be attached to the upper surface of the display panel 100 using a transparent adhesive member.

The cover window CW may be made of a transparent material and may be glass or plastic. For example, when the cover window CW is glass, it may be ultra-thin glass (UTG) having a thickness of about 0.1 mm or less. When the cover window CW is plastic, it may include a transparent polyimide film.

The fingerprint sensor 400 may be disposed on the lower surface of the display panel 100. The fingerprint sensor 400 may be attached to the lower surface of the display panel 100 using a transparent adhesive member.

The fingerprint sensor 400 may include a light sensing layer 410 including sensor pixels SEP, and an optical layer 420 disposed on the light sensing layer 410 and designed to block the sensor pixels SEP of the light sensing layer 410 from noise light. The optical layer 420 may include a light-blocking conductive layer 421 having holes PH and a light transmitting layer 422.

Each of the sensor pixels SEP may overlap some of the holes PH of the light-blocking conductive layer 421 in a third direction (Z-axis direction), which is the thickness direction of the display panel 100. The thickness direction of the display panel 100 may be the same as the thickness direction of, for example, a display substrate DSUB and a fingerprint sensor substrate FSUB, which are described further below. In FIG. 2, each of the sensor pixels SEP overlaps three holes PH in the third direction (Z-axis direction). However, the number of holes PH that each of the sensor pixels SEP overlaps in the third direction (Z-axis direction) is not limited thereto. For example, according to exemplary embodiments, each of the sensor pixels SEP may overlap two or fewer holes PH or four or more holes PH.

The light-blocking conductive layer 421 may include a metal material that does not transmit light or has low light transmittance. For example, the light-blocking conductive layer 421 may be a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

Each hole PH of the light-blocking conductive layer 421 may be a passage through which light reflected by a ridge RID and a valley VAL of the finger F is incident. For example, when the user's finger F touches the cover window CW, light output from the display panel 100 may be reflected by a ridge RID and a valley VAL of the fingerprint of the finger F. Of the light output from the display panel 100, light reflected by the ridge RID of the fingerprint of the finger F may be different from light reflected by the valley VAL of the fingerprint of the finger F. The light reflected by the finger F may be incident on the sensor pixels SEP of the light sensing layer 410 through the display panel 100 and the holes PH of the light-blocking conductive layer 421.

Figure 3:
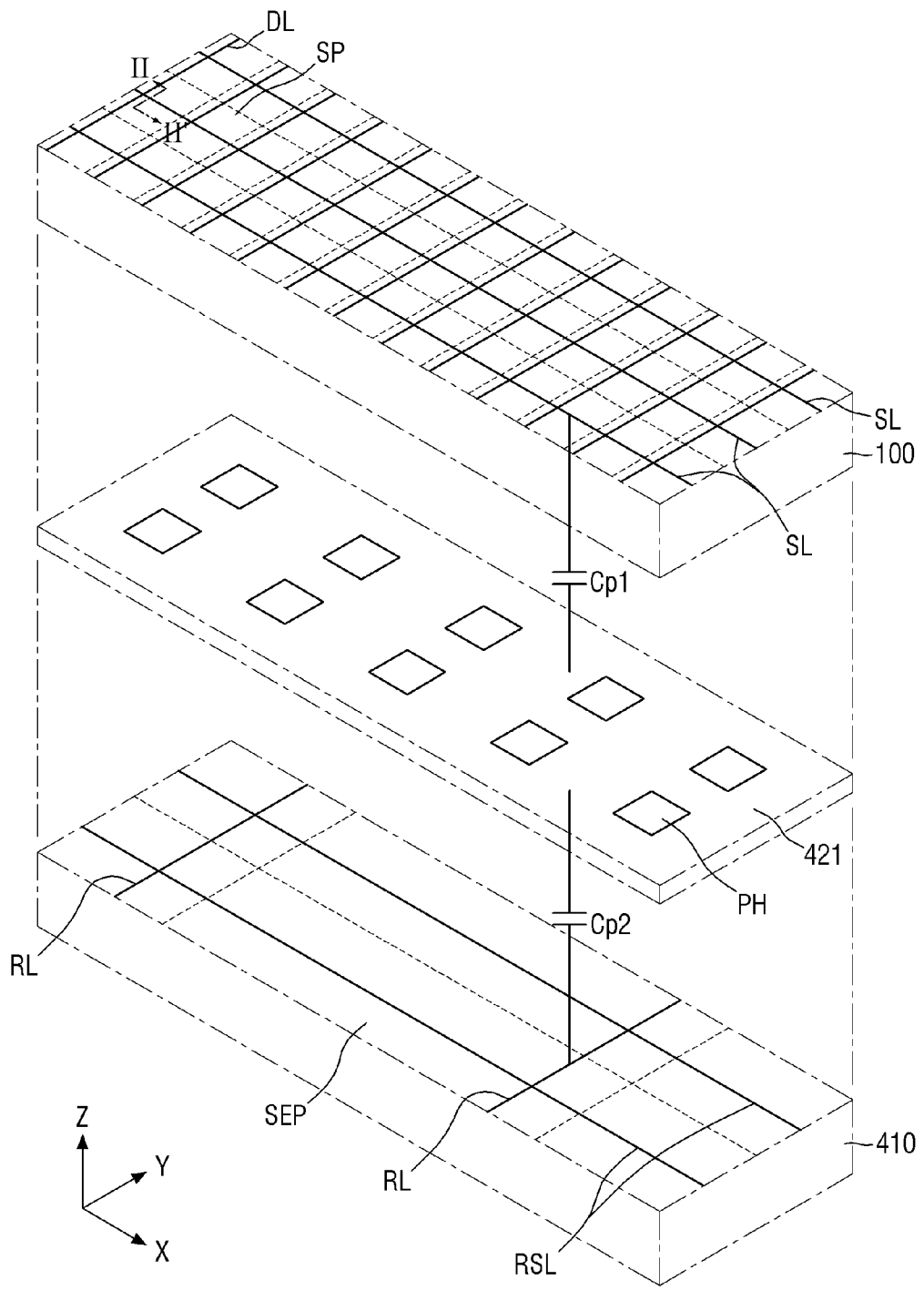
FIG. 3 illustrates an example of the display panel and the fingerprint sensor in a fingerprint sensing area of FIG. 1.

A range LR of light incident on each sensor pixel SEP through the holes PH of the light-blocking conductive layer 421 may be smaller than a distance FP between the ridge RID and the valley VAL of the fingerprint of the finger F. For example, the distance FP between the ridge RID and the valley VAL of the fingerprint of the finger F may be about 500 um. Therefore, it is possible to prevent or reduce noise light from entering each sensor pixel SEP. In addition, a sensing current flowing through a light sensing element of each sensor pixel SEP may vary according to whether incident light is the light reflected by the ridge RID of the fingerprint of the finger F or the light reflected by the valley VAL of the fingerprint of the finger F. Accordingly, a sensing voltage output from each sensor pixel SEP may vary according to whether the incident light is the light reflected by the ridge RID of the fingerprint of the finger F or the light reflected by the valley VAL of the fingerprint of the finger F. Therefore, a sensor driving circuit 480 (see FIG. 5) may recognize a fingerprint pattern of the finger F according to the sensing voltages of the sensor pixels SEP. FIG. 3 illustrates an example of the display panel 100 and the fingerprint sensor 400 in the fingerprint sensing area FSA of FIG. 1.

For ease of description, only subpixels SP, scan lines SL and data lines DL of the display panel 100, the sensor pixels SEP, sensing scan lines RSL and sensing lines RL of the light sensing layer 410 of the fingerprint sensor 400, and the light-blocking conductive layer 421 of the optical layer 420, are illustrated in FIG. 3.

Referring to FIG. 3, the subpixels SP may be arranged in a matrix form in the first direction (X-axis direction) and the second direction (Y-axis direction) intersecting each other. However, the arrangement of the subpixels SP is not limited thereto and may vary according to the size and shape of the display panel 100.

The scan lines SL may extend in the first direction (X-axis direction) and may be arranged in the second direction (Y-axis direction). The data lines DL may extend in the second direction (Y-axis direction) and may be arranged in the first direction (X-axis direction). Each of the subpixels SP may overlap at least one scan line SL and at least one data line DL. Each of the subpixels SP may be connected to at least one scan line SL and at least one data line DL. Therefore, when a scan signal is applied to the scan line SL, each of the subpixels SP may receive a data voltage of the data line DL. Each of the subpixels SP may emit light according to a driving current flowing according to the data voltage.

The sensor pixels SEP of the light sensing layer 410 may be arranged in a matrix form in the first direction (X-axis direction) and the second direction (Y-axis direction) intersecting each other. However, the arrangement of the sensor pixels SEP is not limited thereto and may vary according to the size and shape of the fingerprint sensor 400.

The sensing scan lines RSL may extend in the first direction (X-axis direction) and may be arranged in the second direction (Y-axis direction). The sensing lines RL may extend in the second direction (Y-axis direction) and may be arranged in the first direction (X-axis direction). Each of the sensor pixels SEP may overlap at least one sensing scan line RSL and at least one sensing line RL. Each of the sensor pixels SEP may be connected to at least one sensing scan line RSL and at least one sensing line RL.

The sensor pixels SEP may overlap the holes PH of the light-blocking conductive layer 421 in the third direction (Z-axis direction). In FIG. 3, each of the sensor pixels SEP overlaps three holes PH in the third direction (Z-axis direction). However, the number of holes PH that each of the sensor pixels SEP overlaps in the third direction (Z-axis direction) is not limited thereto. For example, according to exemplary embodiments, each of the sensor pixels SEP may overlap two or fewer holes PH or four or more holes PH.

Since the display panel 100 and the light-blocking conductive layer 421 are located close to each other, a first parasitic capacitance Cp1 may exist between the scan lines SL of the display panel 100 and the light-blocking conductive layer 421. In addition, since the light-blocking conductive layer 421 and the light sensing layer 410 are located close to each other, a second parasitic capacitance Cp2 may exist between the light-blocking conductive layer 421 and the sensing lines RL of the light sensing layer 410. Since a scan signal of each scan line SL of the display panel 100 has a large swing width, the scan signals of the scan lines SL of the display panel 100 may be coupled to the light-blocking conductive layer 421 by the first parasitic capacitance Cp1. In addition, the signals coupled to the light-blocking conductive layer 421 may be coupled to the sensing lines RL of the light-blocking conductive layer 421 by the second parasitic capacitance Cp2. That is, noise due to the scan signals of the scan lines SL of the display panel 100 may adversely affect sensing signals of the sensing lines RL of the light sensing layer 410 as a result of the first parasitic capacitance Cp1 and the second parasitic capacitance Cp2. Alternatively, noise due to the sensing signals of the sensing lines RL of the light sensing layer 410 may adversely affect the scan signals of the scan line SL of the display panel 100 as a result of the first parasitic capacitance Cp1 and the second parasitic capacitance Cp2.

Referring to a comparative example, an optical layer may include a metal layer for blocking noise light. The metal layer of the optical layer may overlap signal lines of a display panel of a display device and signal lines of a light sensing layer. Therefore, signals of the signal lines of the display panel may be coupled to the metal layer of the optical layer, and the signals coupled to the metal layer of the optical layer may be coupled to signals of the signal lines of the light sensing layer. For example, scan signals of scan lines of the display panel may be coupled to the metal layer of the optical layer, and the signals coupled to the metal layer of the optical layer may be coupled to sensing signals of sensing lines of the light sensing layer. In this case, due to a parasitic capacitance(s), noise due to the signals of the display panel may adversely affect the sensing signals of the sensing lines of the light sensing layer.

In contrast, according to exemplary embodiments, to prevent or reduce the scan signals of the scan lines SL of the display panel 100 and the sensing signals of the sensing lines RL of the light sensing layer 410 from affecting each other through the first parasitic capacitance Cp1 and the second parasitic capacitance Cp2, a predetermined voltage may be applied to the light-blocking conductive layer 421. For example, a ground voltage may be applied to the light-blocking conductive layer 421, or any one of fingerprint driving voltages used to drive the fingerprint sensor 400 may be applied.

Figure 4A:
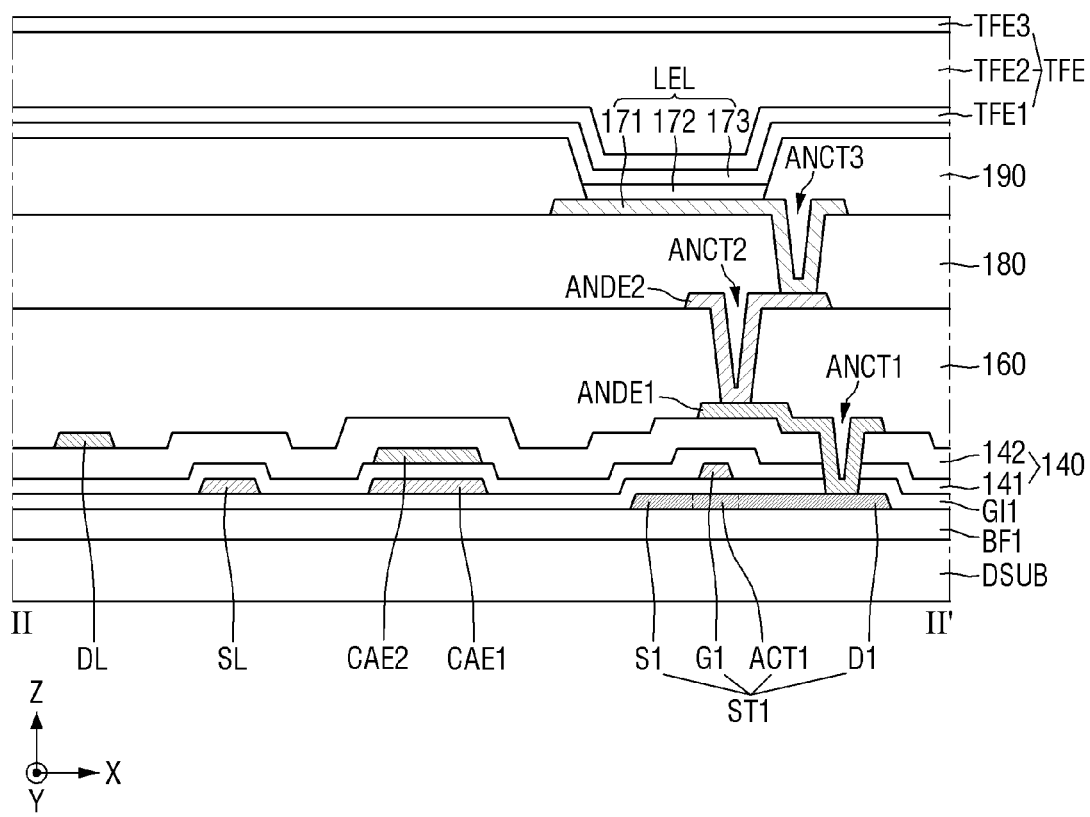
FIG. 4A is a cross-sectional view of an example of the display panel taken along line II-II' of FIG. 3.

FIG. 4A is a cross-sectional view of an example of the display panel 100 taken along line II-II' of FIG. 3.

Referring to FIG. 4A, the display panel 100 may include display pixels displaying an image. Each of the display pixels may include a first thin-film transistor ST1 and a light emitting element LEL.

A display substrate DSUB may be made of an insulating material such as, for example, polymer resin. For example, the display substrate DSUB may include polyimide. The display substrate DSUB may be a flexible substrate that can be bent, folded, rolled, etc.

The display substrate DSUB may include, for example, a plurality of organic layers and a plurality of inorganic layers. For example, the display substrate DSUB may include a first organic layer, a first barrier layer disposed on the first organic layer and including at least one inorganic layer, a second organic layer disposed on the first barrier layer, and a second barrier layer disposed on the second organic layer and including at least one inorganic layer.

A first buffer layer BF1 may be disposed on the display substrate DSUB. The first buffer layer BF1 protects thin-film transistors of a thin-film transistor layer and a light emitting layer 172 of a light emitting element layer from moisture introduced through the display substrate DSUB, which may be vulnerable to moisture penetration. The first buffer layer BF1 may be composed of a plurality of inorganic layers stacked alternately. For example, the first buffer layer BF1 may be a multilayer in which one or more inorganic layers selected from, for example, a silicon nitride layer, a silicon oxynitride layer, a silicon oxide layer, a titanium oxide layer, and an aluminum oxide layer are alternately stacked.

A first active layer ACT1, a first source electrode S1, and a first drain electrode D1 of the first thin-film transistor ST1 may be disposed on the first buffer layer BF1. The first active layer ACT1 of the first thin-film transistor ST1 may include, for example, polycrystalline silicon, monocrystalline silicon, low-temperature polycrystalline silicon, amorphous silicon, or an oxide semiconductor. The first source electrode S1 and the first drain electrode D1 may be formed to have conductivity by doping a silicon semiconductor or an oxide semiconductor with ions or impurities. In an exemplary embodiment, the first active layer ACT1 may overlap a first gate electrode G1 in the third direction (Z-axis direction), which is the thickness direction of the display substrate DSUB, and the first source electrode S1 and the first drain electrode D1 do not overlap the first gate electrode G1 in the third direction (Z-axis direction).

A first gate insulating layer GI1 may be disposed on the first active layer ACT1 of the first thin-film transistor ST1. The first gate insulating layer GI1 may be an inorganic layer such as, for example, a silicon nitride layer, a silicon oxynitride layer, a silicon oxide layer, a titanium oxide layer, or an aluminum oxide layer.

The first gate electrode G1 of the first thin-film transistor ST1 and a first capacitor electrode CAE1 may be disposed on the first gate insulating layer GI1. The first gate electrode G1 may overlap the first active layer ACT1 in the third direction (Z-axis direction). The first capacitor electrode CAE1 may overlap a second capacitor electrode CAE2 in the third direction (Z-axis direction). The first gate electrode G1 may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

A first interlayer insulating film 141 may be disposed on the first gate electrode G1 and the first capacitor electrode CAE1. The first interlayer insulating film 141 may be an inorganic layer such as, for example, a silicon nitride layer, a silicon oxynitride layer, a silicon oxide layer, a titanium oxide layer, or an aluminum oxide layer.

The second capacitor electrode CAE2 may be disposed on the first interlayer insulating film 141. Since the first interlayer insulating film 141 has a predetermined dielectric constant, the first capacitor electrode CAE1, the second capacitor electrode CAE2, and the first interlayer insulating film 141 disposed between the first capacitor electrode CAE1 and the second capacitor electrode CAE2 may form a capacitor. The second capacitor electrode CAE2 may be a single layer or a multilayer made of any one or more of, for example, molybdenum (Mo), aluminum (Al), chromium (Cr), gold (Au), titanium (Ti), nickel (Ni), neodymium (Ne), copper (Cu), and alloys of the same.

A second interlayer insulating film 142 may be disposed on the second capacitor electrode CAE2. The second interlayer insulating film 142 may be an inorganic layer such as, for example, a silicon nitride layer, a silicon oxynitride layer, a silicon oxide layer, a titanium oxide layer, or an aluminum oxide layer. The second interlayer insulating film 142 may include a plurality of inorganic layers.

A first anode connection electrode ANDE1 may be disposed on the second interlayer insulating film 142. The first anode connection electrode ANDE1 may be connected to the first drain electrode D1 of the first thin-film transistor ST1 through a first anode contact hole ANCT1 penetrating the first interlayer insulating film 141 and the second interlayer insulating film 142 to expose the first drain electrode D1 of the first thin-film transistor ST1. The first anode connection electrode ANDE1 may be a single layer or a multilayer made of any one or more of, for example, molybdenum (Mo), aluminum (Al), chromium (Cr), gold (Au), titanium (Ti), nickel (Ni), neodymium (Nd), copper (Cu), and alloys of the same.

A first organic layer 160 for planarization may be disposed on the first anode connection electrode ANDE1. The first organic layer 160 may be an organic layer such as, for example, acryl resin, epoxy resin, phenolic resin, polyamide resin, or polyimide resin.

A second anode connection electrode ANDE2 may be disposed on the first organic layer 160. The second anode connection electrode ANDE2 may be connected to the first anode connection electrode ANDE1 through a second anode contact hole ANCT2 penetrating the first organic layer 160 to expose the first anode connection electrode ANDE1. The second anode connection electrode ANDE2 may be a single layer or a multilayer made of any one or more of, for example, molybdenum (Mo), aluminum (Al), chromium (Cr), gold (Au), titanium (Ti), nickel (Ni), neodymium (Nd), copper (Cu), and alloys of the same.

A second organic layer 180 may be disposed on the second anode connection electrode ANDE2. The second organic layer 180 may be an organic layer such as, for example, acryl resin, epoxy resin, phenolic resin, polyamide resin, or polyimide resin.

In an exemplary embodiment, the second anode connection electrode ANDE2 and the second organic layer 180 may be omitted. In this case, the first anode connection electrode ANDE1 may be directly connected to a first light emitting electrode 171.

In FIG. 4A, the first thin-film transistor ST1 is formed as a top-gate type in which the first gate electrode G1 is located above the first active layer ACT1. However, the present inventive concept is not limited thereto. For example, according to exemplary embodiments, the first thin-film transistor ST1 may be formed as a bottom-gate type in which the first gate electrode G1 is located under the first active layer ACT1, or a double-gate type in which the first gate electrode G1 is located both above and under the first active layer ACT1.

The light emitting elements LEL and a bank 190 may be disposed on the second organic layer 180. Each of the light emitting elements LEL includes the first light emitting electrode 171, the light emitting layer 172, and a second light emitting electrode 173.

The first light emitting electrode 171 may be formed on the second organic layer 180. The first light emitting electrode 171 may be connected to the second anode connection electrode ANDE2 through a third anode contact hole ANCT3 penetrating the second organic layer 180 to expose the second anode connection electrode ANDE2.

In a top emission structure in which light is emitted in a direction from the light emitting layer 172 toward the second light emitting electrode 173, the first light emitting electrode 171 may be made of a metal material having high reflectivity, such as, for example, a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. The APC alloy is an alloy of silver (Ag), palladium (Pd), and copper (Cu).

The bank 190 may be formed on the second organic layer 180 to separate the first light emitting electrode 171 from another first light emitting electrode 171 so as to define an emission area. The bank 190 may be formed to cover edges of the first light emitting electrode 171. The bank 190 may be an organic layer such as, for example, acryl resin, epoxy resin, phenolic resin, polyamide resin, or polyimide resin.

The emission area is an area in which the first light emitting electrode 171, the light emitting layer 172 and the second light emitting electrode 173 are sequentially stacked so that holes from the first light emitting electrode 171 and electrons from the second light emitting electrode 173 combine together in the light emitting layer 172 to emit light.

The light emitting layer 172 is formed on the first light emitting electrode 171 and the bank 190. The light emitting layer 172 may include an organic material to emit light of a predetermined color. For example, the light emitting layer 172 may include a hole transporting layer, an organic material layer, and an electron transporting layer.

The second light emitting electrode 173 is formed on the light emitting layer 172. The second light emitting electrode 173 may cover the light emitting layer 172. The second light emitting electrode 173 may be a common layer common to all emission areas. A capping layer may be formed on the second light emitting electrode 173.

In the top emission structure, the second light emitting electrode 173 may be made of a transparent conductive material (TCO) capable of transmitting light, such as, for example, indium tin oxide (ITO) or indium zinc oxide (IZO), or a semi-transmissive conductive material such as, for example, magnesium (Mg), silver (Ag) or an alloy of Mg and Ag. When the second light emitting electrode 173 is made of a semi-transmissive conductive material, light output efficiency may be increased by a microcavity.

An encapsulation layer TFE may be disposed on the second light emitting electrode 173. The encapsulation layer TFE includes at least one inorganic layer which may prevent or reduce oxygen or moisture from penetrating into the light emitting layer. In addition, the encapsulation layer TFE includes at least one organic layer to protect the light emitting element layer EML from foreign substances such as, for example, dust. For example, the encapsulation layer TFE includes a first inorganic layer TFE1, an organic layer TFE2, and a second inorganic layer TFE3.

The first inorganic layer TFE1 may be disposed on the second light emitting electrode 173, the organic layer TFE2 may be disposed on the first inorganic layer TFE1, and the second inorganic layer TFE3 may be disposed on the organic layer TFE2. Each of the first inorganic layer TFE1 and the second inorganic layer TFE3 may be a multilayer in which one or more inorganic layers selected from, for example, a silicon nitride layer, a silicon oxynitride layer, a silicon oxide layer, a titanium oxide layer, and an aluminum oxide layer are alternately stacked. The organic layer TFE2 may be made of, for example, acryl resin, epoxy resin, phenolic resin, polyamide resin, or polyimide resin.

Figure 4B:
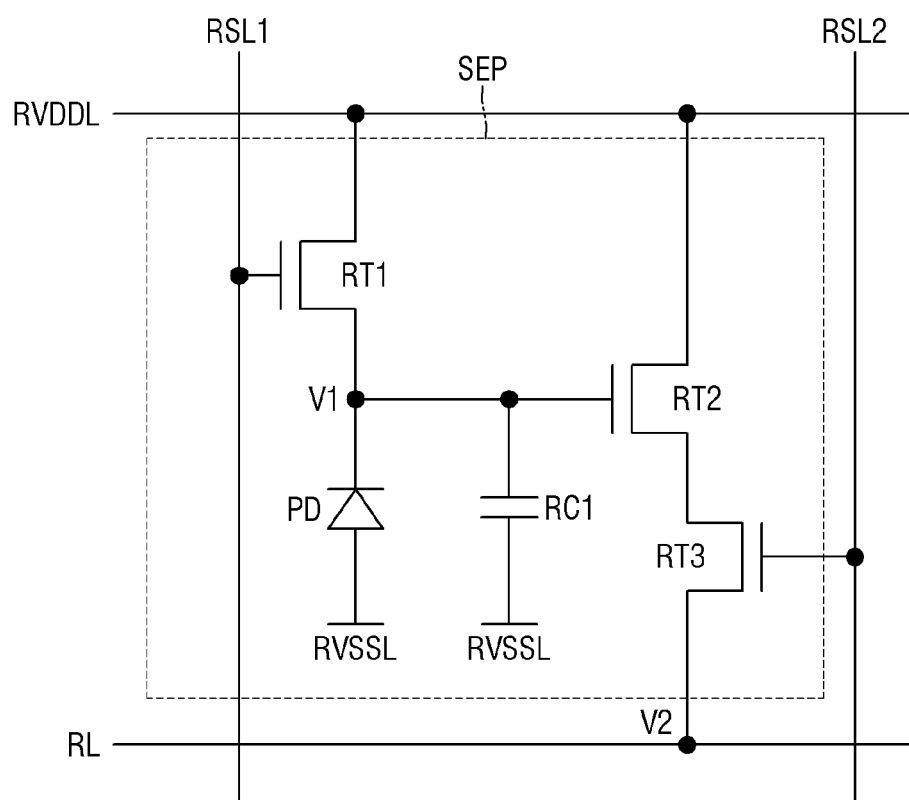
FIG. 4B is a circuit diagram of an example of a sensor pixel of FIG. 3.

FIG. 4B is a circuit diagram of an example of the sensor pixel SEP of FIG. 3.

Referring to FIG. 4B, the sensor pixel SEP includes a light sensing element PD, first through third sensing transistors RT1 through RT3, and a sensing capacitor RC1. The sensing scan lines RSL may include a first sensing scan line RSL1 and a second sensing scan line RSL2.

The first sensing transistor RT1 may be a reset transistor that resets an electric potential V1 of a first electrode of the sensing capacitor RC1 according to a first sensing scan signal of the first sensing scan signal line RSL1. The first sensing transistor RT1 may have a gate electrode connected to the first sensing scan signal line RSL1, a source electrode connected to a cathode of the light sensing element PD and the first electrode of the sensing capacitor RC1, and a drain electrode connected to a second sensing driving voltage line RVDDL to which a second sensing driving voltage is applied.

The second sensing transistor RT2 may be an amplification transistor that converts the electric potential V1 of the first electrode of the sensing capacitor RC1 into a current signal and amplifies the current signal. The second sensing transistor RT2 may have a gate electrode connected to the cathode of the light sensing element PD and the first electrode of the sensing capacitor RC1, a source electrode connected to a drain electrode of the third sensing transistor RT3, and a drain electrode connected to the second sensing driving voltage line RVDDL.

The third sensing transistor RT3 may be a select transistor that transmits the current signal to a sensing line RL when a second sensing scan signal is transmitted to the second sensing scan signal line RSL2. The third sensing transistor RT3 may have a gate electrode connected to the second sensing scan signal line RSL2, a source electrode connected to the sensing line RL, and the drain electrode connected to the source electrode of the second sensing transistor RT2.

The light sensing element PD may include an anode, a PIN semiconductor layer, and the cathode. The cathode of the light sensing element PD may be connected to the first electrode of the sensing capacitor RC1, and the anode may be connected to a first sensing driving voltage line RVSSL to which a first sensing driving voltage lower than the second sensing driving voltage is applied. The PIN semiconductor layer of the light sensing element PD may include a P-type semiconductor layer connected to the anode, an N-type semiconductor layer connected to the cathode, and an I-type semiconductor layer disposed between the P-type semiconductor layer and the N-type semiconductor layer.

In FIG. 4B, the first through third sensing transistors RT1 through RT3 are mainly described as N-type metal oxide semiconductor field effect transistors (MOSFETs). However, the present inventive concept is not limited thereto. For example, according to exemplary embodiments, the first through third sensing transistors RT1 through RT3 may be formed as P-type MOSFETs.

The operation of the sensor pixel SEP illustrated in FIG. 4B will now be described in detail.

First, when the first sensing transistor RT1 is turned on by a reset signal of the first sensing scan signal line RSL1, the electric potential V1 of the first electrode of the sensing capacitor RC1 is reset to an electric potential of the second sensing driving voltage of the second sensing driving voltage line RVDDL.

Then, when light reflected by a fingerprint of a human finger is incident on the light sensing element PD, a leakage current may flow through the light sensing element PD. That is, a sensing current may flow through the light sensing element PD according to the amount of incident light reflected by the fingerprint. The leakage current may cause the sensing capacitor RC1 to be charged with electric charges.

As the sensing capacitor RC1 is charged with electric charges, an electric potential of the gate electrode of the second sensing transistor RT2 connected to the first electrode of the sensing capacitor RC1 increases. When the electric potential of the gate electrode of the second sensing transistor RT2 becomes greater than a threshold voltage, the second sensing transistor RT2 may be turned on.

Then, when a sensing scan signal is transmitted to the second sensing scan signal line RSL2, the third sensing transistor RT3 may be turned on. When the third sensing transistor RT3 is turned on, the current signal flowing through the second sensing transistor RT2 may be transmitted to the sensing line RL. Therefore, a sensing voltage V2 of the sensing line RL may increase, and the sensing voltage V2 of the sensing line RL may be transmitted to the sensor driving circuit 480 (see FIG. 5). The sensor driving circuit 480 (see FIG. 5) may convert the sensing voltage V2 of the sensing line RL into a digital signal through an analog-digital converter (ADC).

The sensing voltage V2 of the sensing line RL is proportional to the electric potential V1 of the first electrode of the sensing capacitor RC1, that is, the amount of electric charge charged in the sensing capacitor RC1, and the amount of electric charge stored in the sensing capacitor RC1 is proportional to the amount of light supplied to the light sensing element PD. Therefore, the sensor driving circuit 480 (see FIG. 5) may determine how much light has been incident on the light sensing element PD of the sensor pixel SEP through the sensing voltage V2 of the sensing line RL. Since the sensor driving circuit 480 (see FIG. 5) can sense the amount of light incident on each sensor pixel SEP, the sensor driving circuit 480 can recognize a user's fingerprint pattern.

Figure 5:
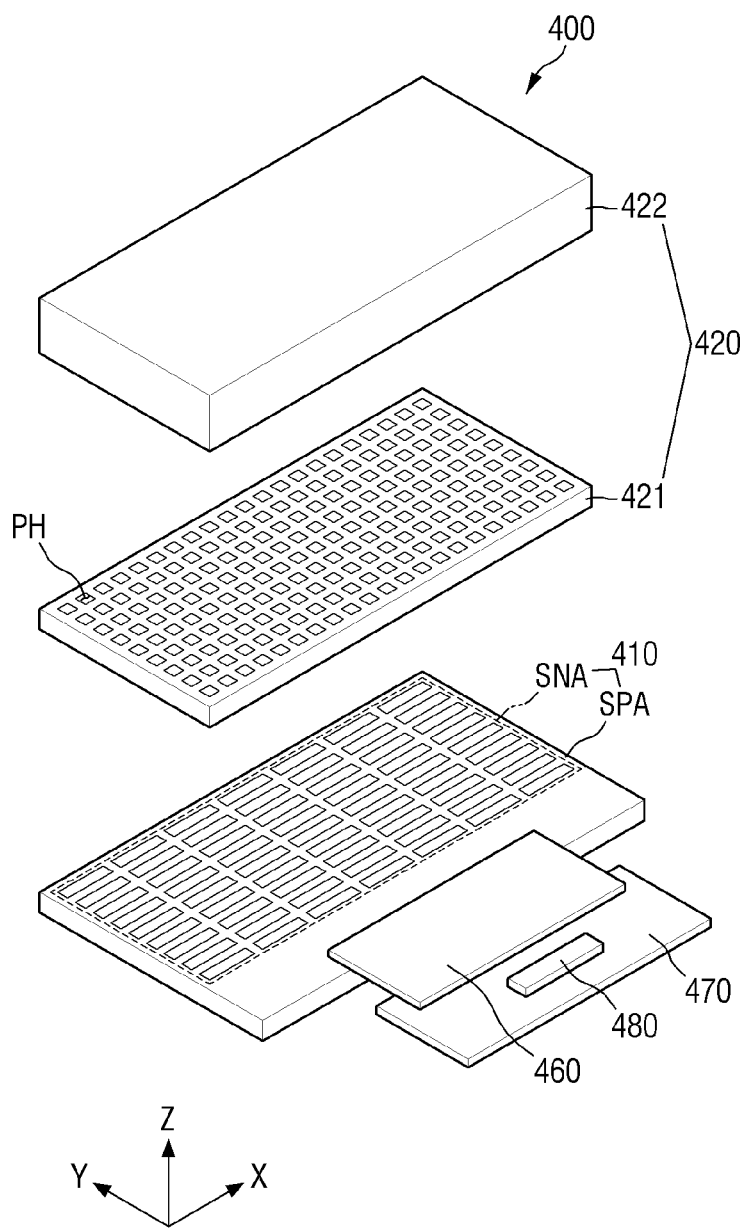
FIG. 5 is an exploded perspective view of an example of the fingerprint sensor of FIG. 1.

FIG. 5 is an exploded perspective view of the fingerprint sensor 400 of FIG. 1.

Referring to FIG. 5, the fingerprint sensor 400 may include the light sensing layer 410, the optical layer 420, a flexible film 460, a sensor circuit board 470, and the sensor driving circuit 480.

The light sensing layer 410 may include a sensor area SNA and a sensor peripheral area SPA. The sensor pixels SEP may be disposed in the sensor area SNA. In an exemplary embodiment, the sensor area SNA is covered by the optical layer 420, and the sensor peripheral area SPA is not covered by the optical layer 420.

The light-blocking conductive layer 421 of the optical layer 420 may be disposed on the sensor area SNA of the light sensing layer 410. The light-blocking conductive layer 421 may include the holes PH through which light passes. The holes PH may be arranged in a matrix form in the first direction (X-axis direction) and the second direction (Y-axis direction). Although the holes PH have a quadrangular planar shape in FIG. 5, the present inventive concept is not limited thereto. For example, according to exemplary embodiments, the holes PH may also have a circular shape, an oval shape, or a polygonal shape other than the quadrangular shape in a plan view.

The light transmitting layer 422 may be disposed on the light-blocking conductive layer 421. The light transmitting layer 422 may be made of polymer resin or plastic that can transmit light. Although an upper surface of the light transmitting layer 422 is flat in FIG. 5, the present inventive concept is not limited thereto. For example, according to exemplary embodiments, to reduce incidence of noise light through the holes PH, the upper surface of the light transmitting layer 422 may also be convex such as, for example, a convex lens.

A side of the flexible film 460 may be disposed on the sensor peripheral area SPA of the light sensing layer 410 which is not covered by the optical layer 420. The side of the flexible film 460 may be disposed on fingerprint pads FP1 and FP2 (see FIG. 6) of the sensor peripheral area SPA of the light sensing layer 410. The side of the flexible film 460 may be attached to the fingerprint pads FP1 and FP2 through a conductive adhesive member such as, for example, an anisotropic conductive film. Therefore, the flexible film 460 may be electrically connected to the fingerprint pads FP1 and FP2.

The other side of the flexible film 460 may be disposed on the sensor circuit board 470. The other side of the flexible film 460 may be attached to the sensor circuit board 470 through a conductive adhesive member such as, for example, an anisotropic conductive film. Therefore, the flexible film 460 may be electrically connected to the sensor circuit board 470.

The flexible film 460 may be, for example, a chip-on-film. The sensor circuit board 470 may be, for example, a flexible printed circuit board or a printed circuit board.

The sensor driving circuit 480 may be disposed on the sensor circuit board 470, but the present inventive concept is not limited thereto. For example, according to exemplary embodiments, the sensor driving circuit 480 may be disposed on the flexible film 460. The sensor driving circuit 480 may receive sensing voltages of the sensor pixels SEP of the light sensing layer 410 through the flexible film 460 and the sensor circuit board 470. Therefore, the sensor driving circuit 480 (see FIG. 5) may determine how much light has been incident on the light sensing element PD of each sensor pixel SEP through the sensing voltage V2 of the sensing line RL. Since the sensor driving circuit 180 (see FIG. 5) can sense the amount of light incident on each sensor pixel SEP, the sensor driving circuit 480 can recognize a user's fingerprint pattern. According to exemplary embodiments, the flexible film 460 or the sensor circuit board 470 includes a conductive connector (e.g., VC1 or VC2, described below) to which a predetermined voltage is applied.

Figure 6:
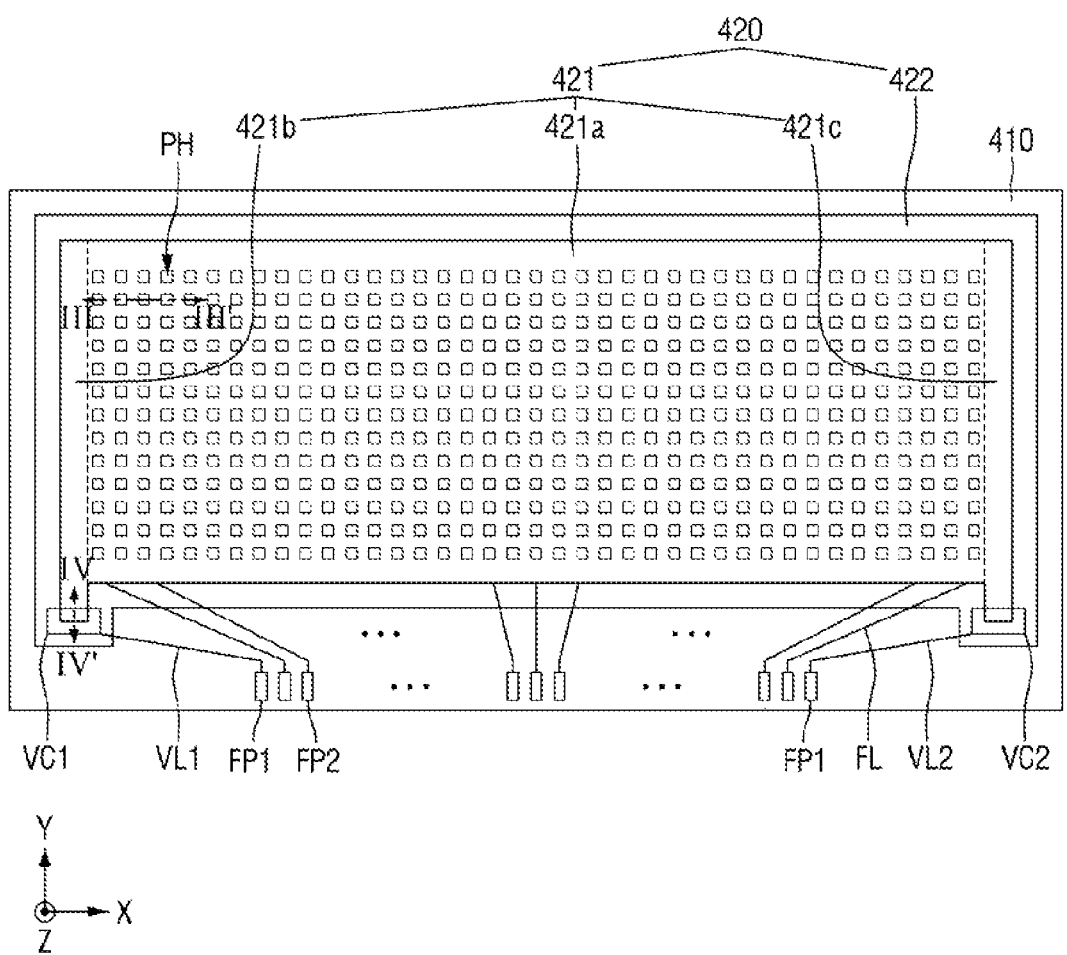
FIG. 6 is a layout view of an example of the fingerprint sensor of FIG. 5.

FIG. 6 is a layout view of an example of the fingerprint sensor 400 of FIG. 5.

For ease of description, only the light sensing layer 410 and the optical layer 420 of the fingerprint sensor 400 are illustrated in FIG. 6.

Referring to FIG. 6, first fingerprint pads FP1 and second fingerprint pads FP2 may be disposed on a side of the light sensing layer 410. For example, in FIG. 6, the first fingerprint pads FP1 and the second fingerprint pads FP2 are disposed on a lower side of the fingerprint sensor 400. However, the location of the first fingerprint pads FP1 and second fingerprint pads FP2 is not limited thereto. The first fingerprint pads FP1 and the second fingerprint pads FP2 may be arranged in the first direction (X-axis direction). The second fingerprint pads FP2 may be disposed between the first fingerprint pads FP1. For example, referring to FIG. 6, a first first fingerprint pad FP1 may be disposed near a left side of the light sensing layer 410, a second first fingerprint pad FP1 may be disposed near a right side of the light sensing layer 410, and a plurality of second fingerprint pads FP2 may be disposed between the first first fingerprint pad FP1 and the second first fingerprint pad FP2. The first fingerprint pads FP1 and the second fingerprint pads FP2 may be electrically connected to the flexible film 460.

The first fingerprint pads FP1 may be connected to a first voltage line VL1 and a second voltage line VL2, respectively. The first voltage line VL1 may be connected to a first conductive connector VC1 disposed on a side (e.g., a left side) of the light sensing layer 410. The second voltage line VL2 may be connected to a second conductive connector VC2 disposed on the other side (e.g., a right side) of the light sensing layer 410.

The second fingerprint pads FP2 may be connected to fan-out lines FL, respectively. The fan-out lines FL may be connected to the sensing lines RL and the sensing scan lines RSL, respectively. In this case, the sensing lines RL may be connected to the second fingerprint pads FP2 through the fan-out lines FL, and the sensing scan lines RSL may be connected to the second fingerprint pads FP2 through the fan-out lines FL. The fan-out lines FL may be disposed between the sensing lines RL and the second fingerprint pads FP2.

The light-blocking conductive layer 421 may include a first light-blocking conductive layer 421a, a second light-blocking conductive layer 421b, and a third light-blocking conductive layer 421c.

The first light-blocking conductive layer 421a may have a mesh or net structure in a plan view. For example, the first light-blocking conductive layer 421a may include the holes PH, thus forming the mesh or net structure. The first light-blocking conductive layer 421a may be disposed on the sensor pixels SEP (see FIG. 5) of the sensor area SNA (see FIG. 5). Therefore, the holes PH may overlap the sensor pixels SEP of the light sensing layer 410 in the third direction (Z-axis direction).

The second light-blocking conductive layer 421b may protrude from a side of the first light-blocking conductive layer 421a and extend in the second direction (Y-axis direction). A length of the second light-blocking conductive layer 421b in the second direction (Y-axis direction) may be greater than a length of the first light-blocking conductive layer 421a in the second direction (Y-axis direction). For example, a side (e.g., a lower side) of the second light-blocking conductive layer 421b may protrude further than a side (e.g., a lower side) of the first light-blocking conductive layer 421a in the second direction (Y-axis direction).

The second light-blocking conductive layer 421b may be disposed on the first conductive connector VC1. For example, the second light-blocking conductive layer 421b may protrude from a side of the first light-blocking conductive layer 421a such that it overlaps the first conductive connector VC1 in the third direction (Z-axis direction), which is the thickness direction of the fingerprint sensor substrate FSUB. The second light-blocking conductive layer 421b may be connected to the first conductive connector VC1 through a conductive adhesive member such as, for example, an anisotropic conductive film. Therefore, the second light-blocking conductive layer 421b may be electrically connected to the first conductive connector VC1.

The third light-blocking conductive layer 421c may protrude from the other side of the first light-blocking conductive layer 421a and extend in the second direction (Y-axis direction). A length of the third light-blocking conductive layer 421c in the second direction (Y-axis direction) may be greater than the length of the first light-blocking conductive layer 421a in the second direction (Y-axis direction). For example, a side (e.g., a lower side) of the third light-blocking conductive layer 421c may protrude further than a side (e.g., the lower side) of the first light-blocking conductive layer 421a in the second direction (Y-axis direction). In an exemplary embodiment, the length of the second light-blocking conductive layer 421b and the length of the third light-blocking conductive layer 421c may be substantially the same.

The third light-blocking conductive layer 421c may be disposed on the second conductive connector VC2. The third light-blocking conductive layer 421c may be connected to the second conductive connector VC2 through a conductive adhesive member such as, for example, an anisotropic conductive film. Therefore, the third light-blocking conductive layer 421c may be electrically connected to the second conductive connector VC2.

The first fingerprint pads FP1 may receive a predetermined voltage from the flexible film 460. Therefore, the predetermined voltage may be applied to the second light-blocking conductive layer 421b via a first fingerprint pad FP1, the first voltage line VL1, and the first conductive connector VC1. In addition, the predetermined voltage may be applied to the third light-blocking conductive layer 421c via another first fingerprint pad FP1, the second voltage line VL2, and the second conductive connector VC2. For example, in an exemplary embodiment, the predetermined voltage may be applied to the first conductive connector VC1 which is connected to one of the first fingerprint pads FP1, and to the second conductive connector VC2 which is connected to another one of the first fingerprint pads FP1, and the predetermined voltage may be applied to the light-blocking conductive layer 421 via an electrical connection made between the light-blocking conductive layer 421 and the first and second conductive connectors VC1 and VC2.

The predetermined voltage may be a ground voltage. In this case, the first fingerprint pads FP1 may be connected to a ground source of the flexible film 460. Alternatively, the predetermined voltage may be a direct current (DC) driving voltage for driving the fingerprint sensor 400. For example, the predetermined voltage may be the first sensing driving voltage applied to the first sensing driving voltage line RVSSL (see FIG. 4B) connected to each sensor pixel SEP. In another example, the predetermined voltage may be the second sensing driving voltage applied to the second sensing driving voltage line RVDDL (see FIG. 4B) connected to each sensor pixel SEP.

The light transmitting layer 422 may be disposed on the light-blocking conductive layer 421. A length of the light transmitting layer 422 in the first direction (X-axis direction) may be greater than a length of the light-blocking conductive layer 421 in the first direction (X-axis direction). However, the present inventive concept is not limited thereto. For example, according to exemplary embodiments, the length of the light transmitting layer 422 in the first direction (X-axis direction) may be substantially the same as the length of the light-blocking conductive layer 421 in the first direction (X-axis direction). A maximum length of the light transmitting layer 422 in the second direction (Y-axis direction) may be greater than a maximum length of the light-blocking conductive layer 421 in the second direction (Y-axis direction). However, the present inventive concept is not limited thereto. For example, according to exemplary embodiments, the maximum length of the light transmitting layer 422 in the second direction (Y-axis direction) may be substantially the same as the maximum length of the light-blocking conductive layer 421 in the second direction (Y-axis direction).

A length of the middle of the light transmitting layer 422 in the second direction (Y-axis direction) may be smaller than a length of a left side of the light transmitting layer 422 in the second direction (Y-axis direction) and a length of a right side of the light transmitting layer 422 in the second direction (Y-axis direction). The length of the left side of the light transmitting layer 422 in the second direction (Y-axis direction) may be substantially the same as the length of the right side of the light transmitting layer 422 in the second direction (Y-axis direction).

As illustrated in FIG. 6, a predetermined voltage may be applied to the second light-blocking conductive layer 421b via a first fingerprint pad FP1, the first voltage line VL1 and the first conductive connector VC1, and may be applied to the third light-blocking conductive layer 421c via a first fingerprint pad FP1, the second voltage line VL2 and the second conductor VC2. Therefore, since the predetermined voltage can be applied to the light-blocking conductive layer 421, the scan signals of the scan lines SL of the display panel 100 can be prevented or reduced from being coupled to the light-blocking conductive layer 421 by the first parasitic capacitance Cp1. Accordingly, noise due to the scan signals of the scan lines SL of the display panel 100 can be prevented or reduced from adversely affecting the sensing signals of the sensing lines RL of the light sensing layer 410, which can occur as a result of the first parasitic capacitance Cp1 and the second parasitic capacitance Cp2.

Figure 7:
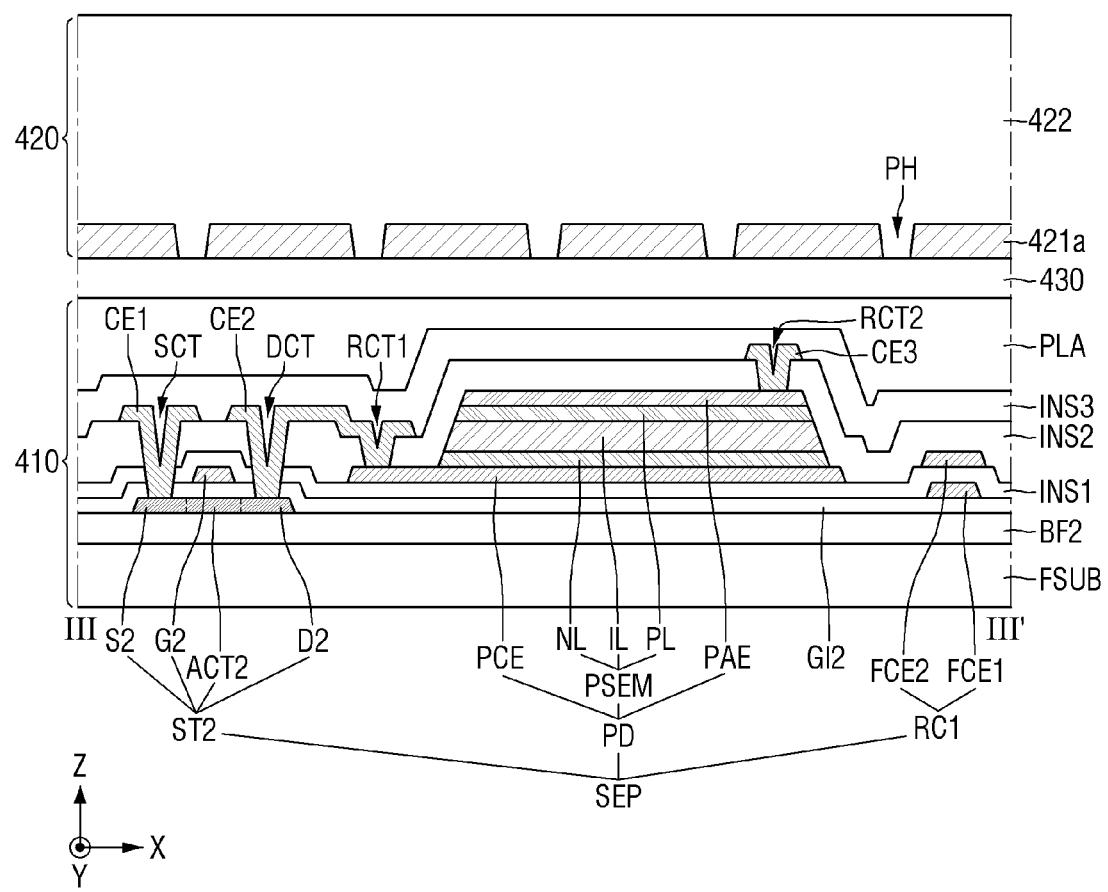
FIG. 7 is a cross-sectional view of an example of the fingerprint sensor taken along line III-III' of FIG. 6.
Figure 8:
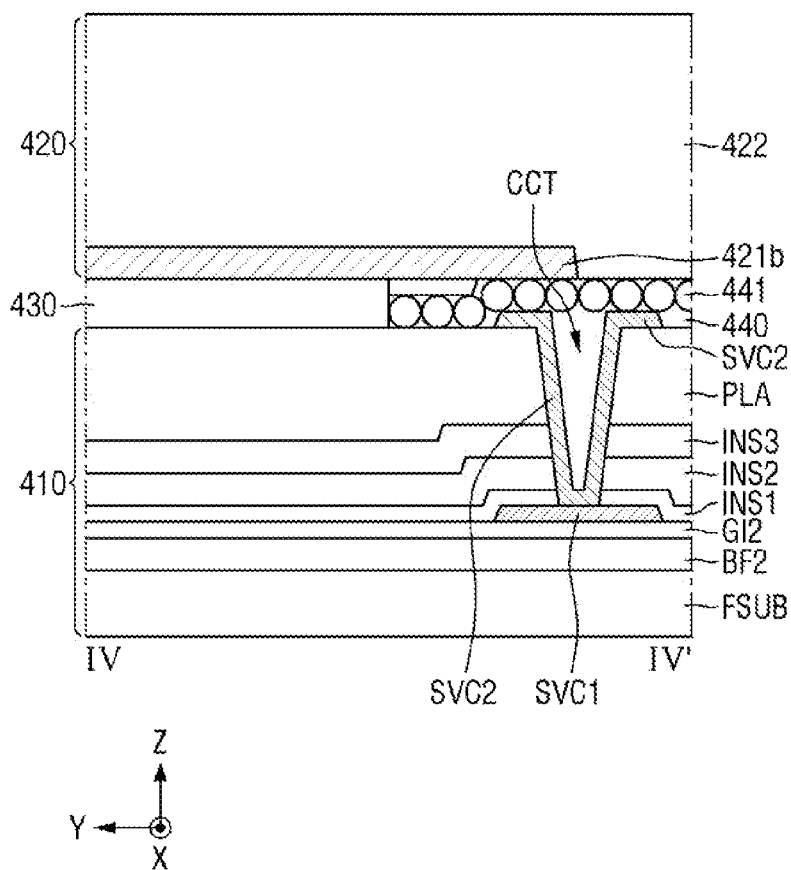
FIG. 8 is a cross-sectional view of an example of the fingerprint sensor taken along line IV-IV' of FIG. 6.

FIG. 7 is a cross-sectional view of an example of the fingerprint sensor 400 taken along line III-III' of FIG. 6. FIG. 8 is a cross-sectional view of an example of the fingerprint sensor 400 taken along line IV-IV' of FIG. 6.

Referring to FIGS. 7 and 8, the light sensing layer 410 may include the sensor pixels SEP for sensing light. Each of the sensor pixels SEP may include a second thin-film transistor ST2, a light sensing element PD, and a sensing capacitor RC1. The second thin-film transistor ST2 illustrated in FIGS. 7 and 8 may be the first sensing transistor RT1 of FIG. 4B.

A second buffer layer BF2 may be disposed on a fingerprint sensor substrate FSUB. The fingerprint sensor substrate FSUB may be made of an insulating material such as, for example, polymer resin. For example, the fingerprint sensor substrate FSUB may include polyimide. The fingerprint sensor substrate FSUB may be a flexible substrate that can be bent, folded, rolled, etc. The first fingerprint pad FP1 and the second fingerprint pad FP2 may be disposed on the fingerprint sensor substrate FSUB. For example, in a plan view, the first fingerprint pad FP1 and the second fingerprint pad FP2 may be disposed on a side (e.g., a lower side) of the fingerprint sensor substrate FSUB.

The second buffer layer BF2 may protect the second thin-film transistor ST2 and the light sensing element PD of the light sensing layer 410 from moisture introduced through the fingerprint sensor substrate FSUB, which may be vulnerable to moisture penetration. The second buffer layer BF2 may be composed of a plurality of inorganic layers stacked alternately. For example, the second buffer layer BF2 may be a multilayer in which one or more inorganic layers selected from, for example, a silicon nitride layer, a silicon oxynitride layer, a silicon oxide layer, a titanium oxide layer, and an aluminum oxide layer are alternately stacked.

A second active layer ACT2, a second source electrode S2, and a second drain electrode D2 of the second thin-film transistor ST2 may be disposed on the second buffer layer BF2. The second active layer ACT2 includes, for example, polycrystalline silicon, monocrystalline silicon, low-temperature polycrystalline silicon, amorphous silicon, or an oxide semiconductor. The second source electrode S2 and the second drain electrode D2 may be formed to have conductivity by doping a silicon semiconductor or an oxide semiconductor with ions or impurities. In an exemplary embodiment, the second active layer ACT2 overlaps a second gate electrode G2 in the third direction (Z-axis direction), which is the thickness direction of the fingerprint sensor substrate FSUB, and the second source electrode S2 and the second drain electrode D2 do not overlap the second gate electrode G2 in the third direction (Z-axis direction).

A second gate insulating layer GI2 may be disposed on the second active layer ACT2. The second gate insulating layer GI2 may be an inorganic layer such as, for example, a silicon nitride layer, a silicon oxynitride layer, a silicon oxide layer, a titanium oxide layer, or an aluminum oxide layer.

The second gate electrode G2 of the second thin-film transistor ST2, a first fingerprint capacitor electrode FCE1, and a first sub-conductive connector SVC1 of the first conductive connector VC1 may be disposed on the second gate insulating layer GI2. The second gate electrode G2 may overlap the second active layer ACT2 in the third direction (Z-axis direction). The first fingerprint capacitor electrode FCE1 may overlap a first sensing electrode PCE of the light sensing element PD. Each of the second gate electrode G2, the first fingerprint capacitor electrode FCE1, and the first sub-conductive connector SVC1 may be a single layer or a multilayer made of any one or more of, for example, molybdenum (Mo), aluminum (Al), chromium (Cr), gold (Au), titanium (Ti), nickel (Ni), neodymium (Nd), copper (Cu), and alloys of the same.

The first sub-conductive connector SVC1 may be connected to the first voltage line VL1 (see FIG. 6). The first voltage line VL1 (see FIG. 6), the second voltage line VL2 (see FIG. 6), and the fan-out lines FL (see FIG. 6) may be disposed on the second gate insulating layer GI2. That is, the first voltage line VL1 (see FIG. 6), the second voltage line VL2 (see FIG. 6), and the fan-out lines FL (see FIG. 6) may be disposed on the same layer and made of the same material as the second gate electrode G2, the first fingerprint capacitor electrode FCE1 and the first sub-conductive connector SVC1.

A first insulating layer INS1 may be disposed on the second gate electrode G2, the first fingerprint capacitor electrode FCE1, and the first sub-conductive connector SVC1. The first insulating layer INS1 may be an inorganic layer such as, for example, a silicon nitride layer, a silicon oxynitride layer, a silicon oxide layer, a titanium oxide layer, or an aluminum oxide layer. The first insulating layer INS1 may include a plurality of inorganic layers.

The light sensing element PD and a second fingerprint capacitor electrode FCE2 may be disposed on the first insulating layer INS1. The second fingerprint capacitor electrode FCE2 may overlap the first fingerprint capacitor electrode FCE1 in the third direction (Z-axis direction). Since the first insulating layer INS1 has a predetermined dielectric constant, the first fingerprint capacitor electrode FCE1, the second fingerprint capacitor electrode FCE2, and the first insulating layer INS1 disposed between the first fingerprint capacitor electrode FCE1 and the second fingerprint capacitor electrode FCE2 may form the sensing capacitor RC1. The second fingerprint capacitor electrode FCE2 may be connected to a third connection electrode CE3 or may be directly connected to the first sensing driving voltage line RVSSL (see FIG. 4B).

In FIG. 7, the first fingerprint capacitor electrode FCE1 is disposed on the second gate insulating layer GI2, and the second fingerprint capacitor electrode FCE2 is disposed on the first insulating layer INS1. However, the present inventive concept is not limited thereto. For example, according to exemplary embodiments, the first fingerprint capacitor electrode FCE1 may be disposed on the first insulating layer INS1, and the second fingerprint capacitor electrode FCE2 may be disposed on a second insulating layer INS2. Alternatively, the first fingerprint capacitor electrode FCE1 may be disposed on the second insulating layer INS2, and the second fingerprint capacitor electrode FCE2 may be disposed on a third insulating layer INS3.

The light sensing element PD may be, for example, a photodiode as illustrated in FIG. 7. However, the present inventive concept is not limited thereto. For example, according to exemplary embodiments, the light sensing element PD may be formed as a phototransistor. The light sensing element PD may include the first sensing electrode PCE, a sensing semiconductor layer PSEM, and a second sensing electrode PAE. The first sensing electrode PCE may be a cathode, and the second sensing electrode PAE may be an anode.

The first sensing electrode PCE may be disposed on the first insulating layer INS1. The first sensing electrode PCE may be made of the same material as the second fingerprint capacitor electrode FCE2. Each of the first sensing electrode PCE and the second fingerprint capacitor electrode FCE2 may be, for example, a single layer of molybdenum (Mo), titanium (Ti), copper (Cu) or aluminum (Al), or may have, for example, a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide.

The sensing semiconductor layer PSEM may be disposed on the first sensing electrode PCE. The sensing semiconductor layer PSEM may be formed in a PIN structure in which a P-type semiconductor layer PL, an I-type semiconductor layer IL, and an N-type semiconductor layer NL are sequentially stacked. When the sensing semiconductor layer PSEM is formed in the PIN structure, the I-type semiconductor layer IL is depleted by the P-type semiconductor layer PL and the N-type semiconductor layer NL. Accordingly, an electric field is generated in the I-type semiconductor layer IL, and holes and electrons generated by light are drifted by the electric field. Therefore, the holes may be collected to the second sensing electrode PAE through the P-type semiconductor layer PL, and the electrons may be collected to the first sensing electrode PCE through the N-type semiconductor layer NL.

The P-type semiconductor layer PL may be disposed close to a surface on which external light is incident, and the N-type semiconductor layer NL may be disposed far away from the surface on which the external light is incident. Since drift mobility of holes is low compared with drift mobility of electrons, the P-type semiconductor layer PL may be formed close to the incident surface of the external light in order to increase collection efficiency due to incident light.

The N-type semiconductor layer NL may be disposed on the first sensing electrode PCE, the I-type semiconductor layer IL may be disposed on the N-type semiconductor layer NL, and the P-type semiconductor layer PL may be disposed on the I-type semiconductor layer IL. In this case, the P-type semiconductor layer PL may be formed by doping amorphous silicon (a-Si:H) with a P-type dopant. The I-type semiconductor layer IL may be made of amorphous silicon germanium (a-SiGe:H) or amorphous silicon carbide (a-SiC:H). The N-type semiconductor layer NL may be formed by doping amorphous silicon germanium (a-SiGe:H) or amorphous silicon carbide (a-SiC:H) with an N-type dopant. The P-type semiconductor layer PL and the N-type semiconductor layer NL may be formed to a thickness of about 500 Å, and the I-type semiconductor layer IL may be formed to a thickness of about 5,000 to about 10,000 Å.

Alternatively, the N-type semiconductor layer NL may be disposed on the first sensing electrode PCE, the I-type semiconductor layer IL may be omitted, and the P-type semiconductor layer PL may be disposed on the N-type semiconductor layer NL. In this case, the P-type semiconductor layer PL may be formed by doping amorphous silicon (a-Si:H) with a P-type dopant. The N-type semiconductor layer NL may be formed by doping amorphous silicon germanium (a-SiGe:H) or amorphous silicon carbide (a-SiC:H) with an N-type dopant. The P-type semiconductor layer PL and the N-type semiconductor layer NL may be formed to a thickness of about 500 Å.

In addition, an upper surface or a lower surface of at least any one of the first sensing electrode PCE, the P-type semiconductor layer PL, the I-type semiconductor layer IL, the N-type semiconductor layer NL, and the second sensing electrode PAE may be formed to have an uneven structure through a texturing process to increase an absorption rate of external light. The texturing process is a process of forming a material surface into an uneven structure and processing the material surface into a shape such as a fabric surface. The texturing process may be performed through an etching process using photolithography, an anisotropic etching process using a chemical solution, or a groove forming process using mechanical scribing.

The second sensing electrode PAE may be disposed on the P-type semiconductor layer PL. The second sensing electrode PAE may be made of a transparent conductive material (TCO) capable of transmitting light such as, for example, indium tin oxide (ITO) or indium zinc oxide (IZO).

The second insulating layer INS2 may be disposed on the light sensing element PD and the second fingerprint capacitor electrode FCE2. The second insulating layer INS2 may be an inorganic layer such as, for example, a silicon nitride layer, a silicon oxynitride layer, a silicon oxide layer, a titanium oxide layer, or an aluminum oxide layer. The second insulating layer INS2 may include a plurality of inorganic layers.

A first connection electrode CE1, a second connection electrode CE2, and the third connection electrode CE3 may be disposed on the second insulating layer INS2.

The first connection electrode CE1 may be connected to the second source electrode S2 of the second thin-film transistor ST2 through a source contact hole SCT penetrating the first insulating layer INS1 and the second insulating layer INS2 to expose the second source electrode S2 of the second thin-film transistor ST2.

The second connection electrode CE2 may be connected to the second drain electrode D2 of the second thin-film transistor ST2 through a drain contact hole DCT penetrating the first insulating layer INS1 and the second insulating layer INS2 to expose the second drain electrode D2 of the second thin-film transistor ST2. The second connection electrode CE2 may be connected to the first sensing electrode PCE through a first sensing contact hole RCT1 penetrating the second insulating layer INS2 to expose the first sensing electrode PCE. Therefore, the second drain electrode D2 of the second thin-film transistor ST2 and the first sensing electrode PCE of the light sensing element PD may be connected by the second connection electrode CE2.

The third connection electrode CE3 may be connected to the second sensing electrode PAE through a second sensing contact hole RCT2 penetrating the second insulating layer INS2 to expose the second sensing electrode PAE. The third connection electrode CE3 may be connected to the first sensing driving voltage line RVSSL.

Each of the first connection electrode CE1, the second connection electrode CE2, and the third connection electrode CE3 may be a single layer or a multilayer made of any one or more of, for example, molybdenum (Mo), aluminum (Al), chromium (Cr), gold (Au), titanium (Ti), nickel (Ni), neodymium (Nd), copper (Cu), and alloys of the same.

The third insulating layer INS3 may be disposed on the first connection electrode CE1, the second connection electrode CE2, and the third connection electrode CE3. The third insulating layer INS3 may be an inorganic layer such as, for example, a silicon nitride layer, a silicon oxynitride layer, a silicon oxide layer, a titanium oxide layer, or an aluminum oxide layer. The third insulating layer INS3 may include a plurality of inorganic layers. The third insulating layer INS3 can be omitted in exemplary embodiments.

A planarization layer PLA may be disposed on the third insulating layer INS3. The planarization layer PLA may be an organic layer such as, for example, acryl resin, epoxy resin, phenolic resin, polyamide resin, or polyimide resin.

A second sub-conductive connector SVC2 of the first conductive connector VC1 may be disposed on the planarization layer PLA. The second sub-conductive connector SVC2 may be connected to the first sub-conductive connector SVC1 through a connection contact hole CCT penetrating the first insulating layer INS1, the second insulating layer INS2, the third insulating layer INS3, the planarization layer PLA.

In FIG. 8, the first sub-conductive connector SVC1 is disposed on the second gate insulating layer GI2, and the second sub-conductive connector SVC2 is disposed on the planarization layer PLA. However, the present inventive concept is not limited thereto. For example, according to exemplary embodiments, the first sub-conductive connector SVC1 may be disposed on the first insulating layer INS1, and the second sub-conductive connector SVC2 may be disposed on the second insulating layer INS2.

The first light-blocking conductive layer 421a and the second light-blocking conductive layer 421b may be disposed on the planarization layer PLA of the light sensing layer 410. The first light-blocking conductive layer 421a and the second light-blocking conductive layer 421b may include a metal material that does not transmit light or has low light transmittance. For example, each of the first light-blocking conductive layer 421a and the second light-blocking conductive layer 421b may be a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

The first light-blocking conductive layer 421a may include the holes PH. Some of the holes PH may overlap the light sensing element PD of a sensor pixel SEP in the third direction (Z-axis direction). Therefore, light passing through some of the holes PH may be incident on the light sensing element PD of the sensor pixel SEP.

The light transmitting layer 422 may be disposed on the first light-blocking conductive layer 421a and the second light-blocking conductive layer 421b. The light transmitting layer 422 may fill the holes PH of the first light-blocking conductive layer 421a. The light transmitting layer 422 may be made of polymer resin or plastic that can transmit light.

A transparent adhesive member 430 may be disposed between the planarization layer PLA of the light sensing layer 410 and the first light-blocking conductive layer 421a, and between the planarization layer PLA and the second light-blocking conductive layer 421b. Thus, the transparent adhesive member 430 may be disposed between the sensor pixels SEP and the light-blocking conductive layer 421. The transparent adhesive member 430 may be a transparent adhesive resin such as, for example, optical clear resin (OCR) or a transparent adhesive film such as, for example, an optically clear adhesive (OCA) film.

A conductive adhesive member 440 such as, for example, an anisotropic conductive film may be disposed between the second sub-conductive connector SVC2 and the second light-blocking conductive layer 421b. The conductive adhesive member 440 may include conductive balls 441. Therefore, the second sub-conductive connector SVC2 may be electrically connected to the second light-blocking conductive layer 421b.

The second sub-conductive connector SVC2 may also be disposed on the second insulating layer INS2. In this case, the second sub-conductive connector SVC2 may be exposed without being covered by the planarization layer PLA. In this case, the conductive adhesive member 440 disposed on the second sub-conductive connector SVC2 may be thicker than the planarization layer PLA.

As illustrated in FIGS. 7 and 8, the first sub-conductive connector SVC1 of the first conductive connector VC1 may be connected to the first voltage line VL1 (see FIG. 6), the second sub-conductive connector SVC2 may be connected to the first sub-conductive connector SVC1 through the connection contact hole CCT, and the second light-blocking conductive layer 421b may be connected to the second sub-conductive connector SVC2 through the conductive adhesive member 440. Therefore, a predetermined voltage applied to a first fingerprint pad FP1 (see FIG. 6) may be applied to the first light-blocking conductive layer 421a and the second light-blocking conductive layer 421b via the first voltage line VL1 (see FIG. 6) connected to the first fingerprint pad FP1 (see FIG. 6) and the first conductive connector VC1. Therefore, the scan signals of the scan lines SL of the display panel 100 can be prevented or reduced from being coupled to the light-blocking conductive layer 421 (see FIG. 6) by the first parasitic capacitance Cp1. Accordingly, noise due to the scan signals of the scan lines SL of the display panel 100 can be prevented or reduced from adversely affecting the sensing signals of the sensing lines RL of the light sensing layer 410, which can occur as a result of the first parasitic capacitance Cp1 and the second parasitic capacitance Cp2.

Since the second conductive connector VC2 and the third light-blocking conductive layer 421c of FIG. 6 can be electrically connected in substantially the same way as the first conductive connector VC1 and the second light-blocking conductive layer 421b illustrated in FIG. 8, a description of the second conductive connector VC2 and the third light-blocking conductive layer 421c will be omitted for convenience of description.

Figure 9:
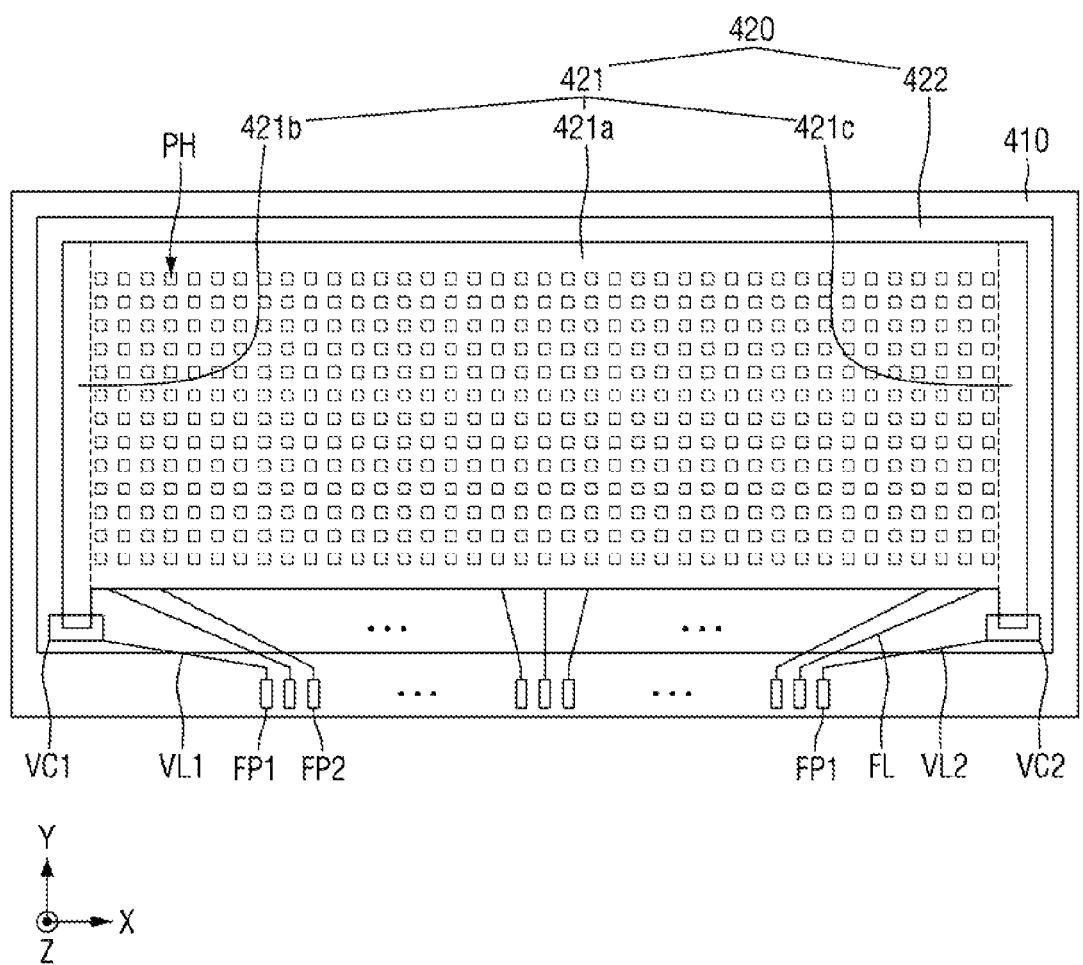
FIG. 9 is a layout view of an example of the fingerprint sensor of FIG. 5.

FIG. 9 is a layout view of an example of the fingerprint sensor 400 of FIG. 5.

The exemplary embodiment of FIG. 9 is different from the exemplary embodiment of FIG. 6 in that a light transmitting layer 422 has a quadrangular planar shape. For convenience of explanation, in describing FIG. 9, differences from the exemplary embodiment of FIG. 6 will be mainly described, and a further description of elements and technical aspects previously described may be omitted.

Referring to FIG. 9, the light transmitting layer 422 may overlap fan-out lines FL. A length of the middle of the light transmitting layer 422 in the second direction (Y-axis direction), a length of a left side of the light transmitting layer 422 in the second direction (Y-axis direction), and a length of a right side of the light transmitting layer 422 in the second direction (Y-axis direction) may be substantially equal.

Figure 10:
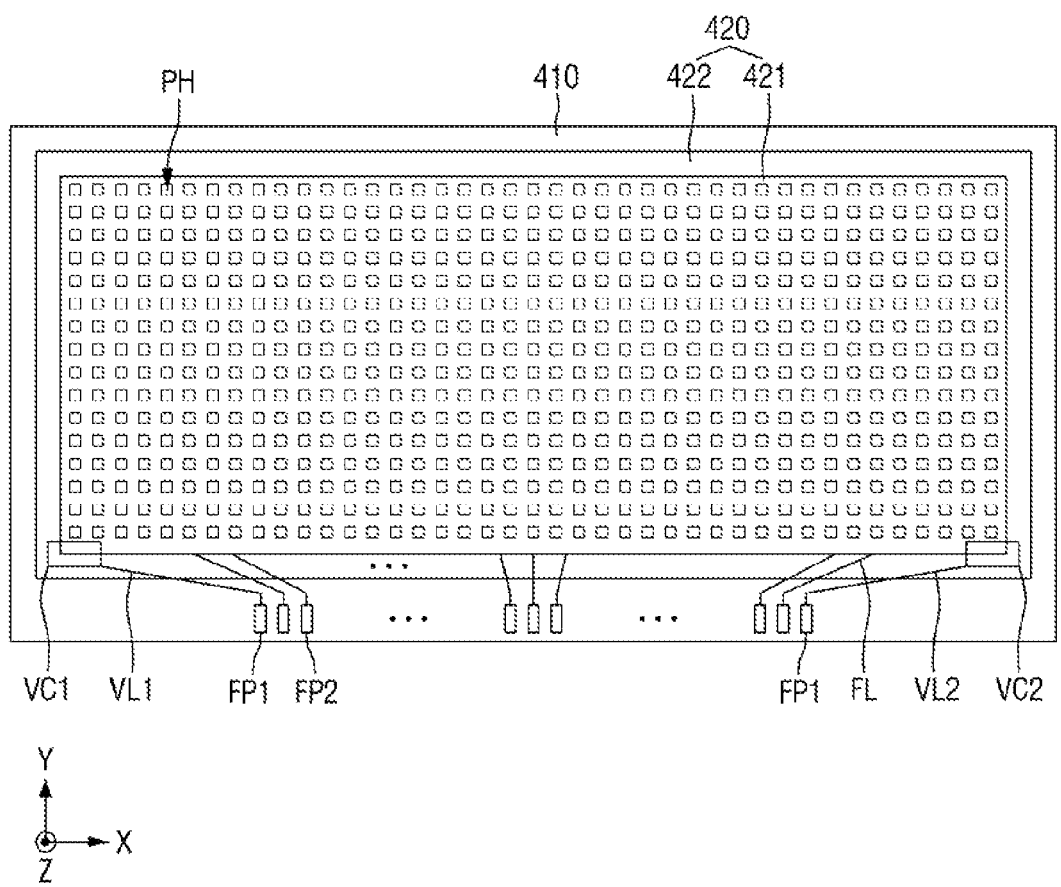
FIG. 10 is a layout view of an example of the fingerprint sensor of FIG. 5.

FIG. 10 is a layout view of an example of the fingerprint sensor 400 of FIG. 5.

The exemplary embodiment of FIG. 10 is different from the exemplary embodiment of FIG. 6 in that a light-blocking conductive layer 421 is extended to overlap not only sensor pixels SEP, but also fan-out lines FL. For convenience of explanation, in describing FIG. 10, differences from the exemplary embodiment of FIG. 6 will be mainly described, and a further description of elements and technical aspects previously described may be omitted.

Referring to FIG. 10, the light-blocking conductive layer 421 may have a quadrangular planar shape. The light-blocking conductive layer 421 may overlap not only the sensor pixels SEP of a light sensing layer 410, but also a first voltage line VL1, a second voltage line VL2 and the fan-out lines FL in the third direction (Z-axis direction).

The light-blocking conductive layer 421 may have a mesh or net structure in a plan view. The light-blocking conductive layer 421 may include holes PH. Therefore, some of the holes PH of the light-blocking conductive layer 421 may overlap not only the sensor pixels SEP of the light sensing layer 410, but also the first voltage line VL1, the second voltage line VL2 and the fan-out lines FL in the third direction (Z-axis direction).

As illustrated in FIG. 10, when the light-blocking conductive layer 421 is extended to overlap not only the sensor pixels SEP, but also the fan-out lines FL in the third direction (Z-axis direction), the cross-sectional area of the light-blocking conductive layer 421 is increased, thereby reducing the resistance of the light-blocking conductive layer 421. Therefore, a predetermined voltage can be stably applied to the light-blocking conductive layer 421. Accordingly, scan signals of scan lines SL of a display panel 100 can be further prevented or reduced from being coupled to the light-blocking conductive layer 421 by a first parasitic capacitance Cp1.

Figure 11:
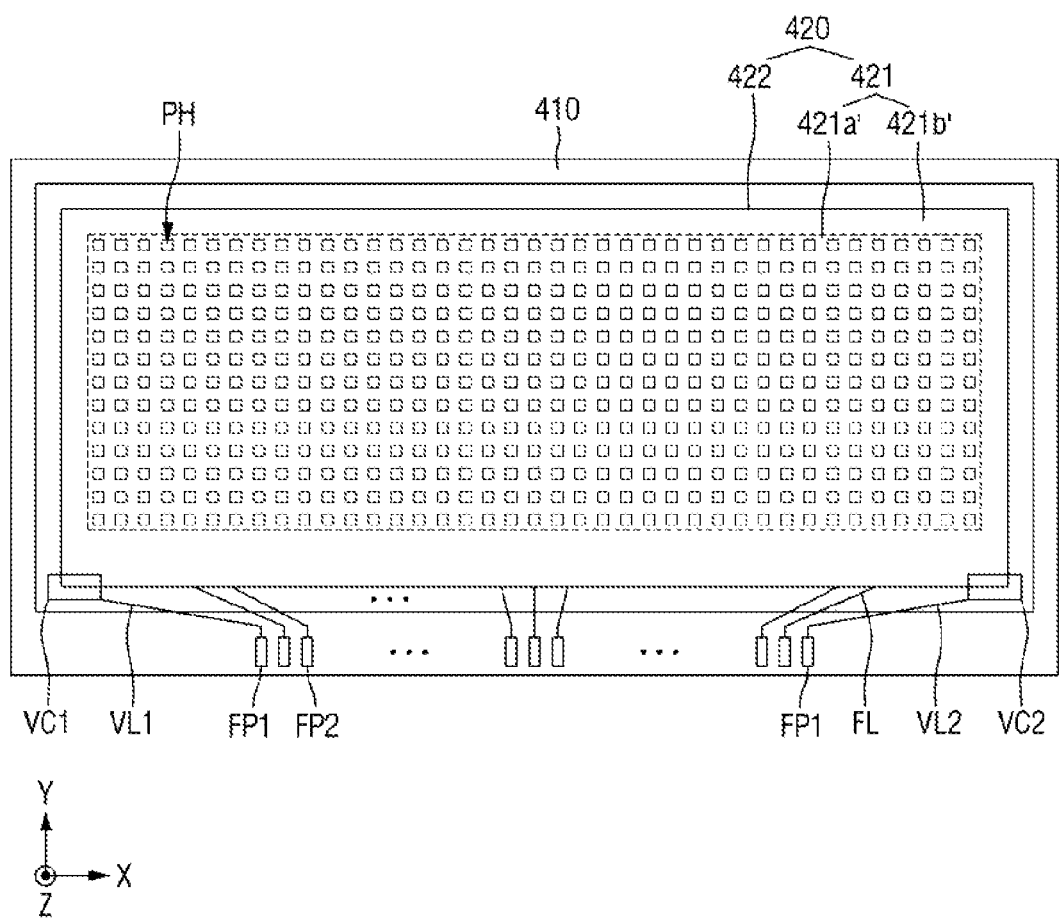
FIG. 11 is a layout view of an example of the fingerprint sensor of FIG. 5.

FIG. 11 is a layout view of an example of the fingerprint sensor 400 of FIG. 5.

The exemplary embodiment of FIG. 11 is different from the exemplary embodiment of FIG. 6 in that a light-blocking conductive layer 421 is extended to overlap not only sensor pixels SEP, but also fan-out lines FL. For convenience of explanation, in describing FIG. 11, differences from the exemplary embodiment of FIG. 6 will be mainly described, and a further description of elements and technical aspects previously described may be omitted.

Referring to FIG. 11, the light-blocking conductive layer 421 may have a quadrangular planar shape. The light-blocking conductive layer 421 may overlap not only the sensor pixels SEP of a light sensing layer 410, but also a first voltage line VL1, a second voltage line VL2 and the fan-out lines FL in the third direction (X-axis direction).

The light-blocking conductive layer 421 may include a first light-blocking conductive layer 421a' and a second light-blocking conductive layer 421b'. The first light-blocking conductive layer 421a' and the second light-blocking conductive layer 421b' may include a metal material that does not transmit light or has low light transmittance. For example, each of the first light-blocking conductive layer 421a' and the second light-blocking conductive layer 421b' may be a single layer or a multilayer made of any one or more of, for example, molybdenum (Mo), aluminum (Al), chromium (Cr), gold (Au), titanium (Ti), nickel (Ni), neodymium (Nd), copper (Cu), and alloys of the same. The first light-blocking conductive layer 421a' and the second light-blocking conductive layer 421b' may be made of the same material.

The first light-blocking conductive layer 421a' may have a mesh or net structure in a plan view. The first light-blocking conductive layer 421a' may include holes PH. The first light-blocking conductive layer 421a' may be disposed on the sensor pixels SEP (see FIG. 5) of a sensor area SNA (see FIG. 5). Therefore, the holes PH may overlap the sensor pixels SEP of the light sensing layer 410 in the third direction (Z-axis direction).

The second light-blocking conductive layer 421b' may be adjacent to, for example, may surround, the first light-blocking conductive layer 421a'. For example, the second light-blocking conductive layer 421b' may surround an entirety of the first light-blocking conductive layer 421a'. The second light-blocking conductive layer 421b' may extend from four sides of the first light-blocking conductive layer 421a'. The second light-blocking conductive layer 421b' may be shaped as a quadrangular frame or a quadrangular window frame in a plan view. The second light-blocking conductive layer 421b' may overlap the first voltage line VL1, the second voltage line VL2, and the fan-out lines FL. The second light-blocking conductive layer 421b' does not include the holes PH. The second light-blocking conductive layer 421b' may overlap the first conductive connector VC1 and the second conductive connector VC2 in the thickness direction (Z-axis direction). As illustrated in FIG. 11, when the light-blocking conductive layer 421 is extended to overlap not only the sensor pixels SEP, but also the fan-out lines FL in the third direction (Z-axis direction), the cross-sectional area of the light-blocking conductive layer 421 is increased, thereby reducing the resistance of the light-blocking conductive layer 421. In addition, since the second light-blocking conductive layer 421b' does not include the holes PH, the resistance of the light-blocking conductive layer 421 may be lower than that of the exemplary embodiment of FIG. 10. Therefore, a predetermined voltage can be stably applied to the light-blocking conductive layer 421. Accordingly, scan signals of scan lines SL of a display panel 100 can be further prevented or reduced from being coupled to the light-blocking conductive layer 421 by a first parasitic capacitance Cp1.

Figure 12:
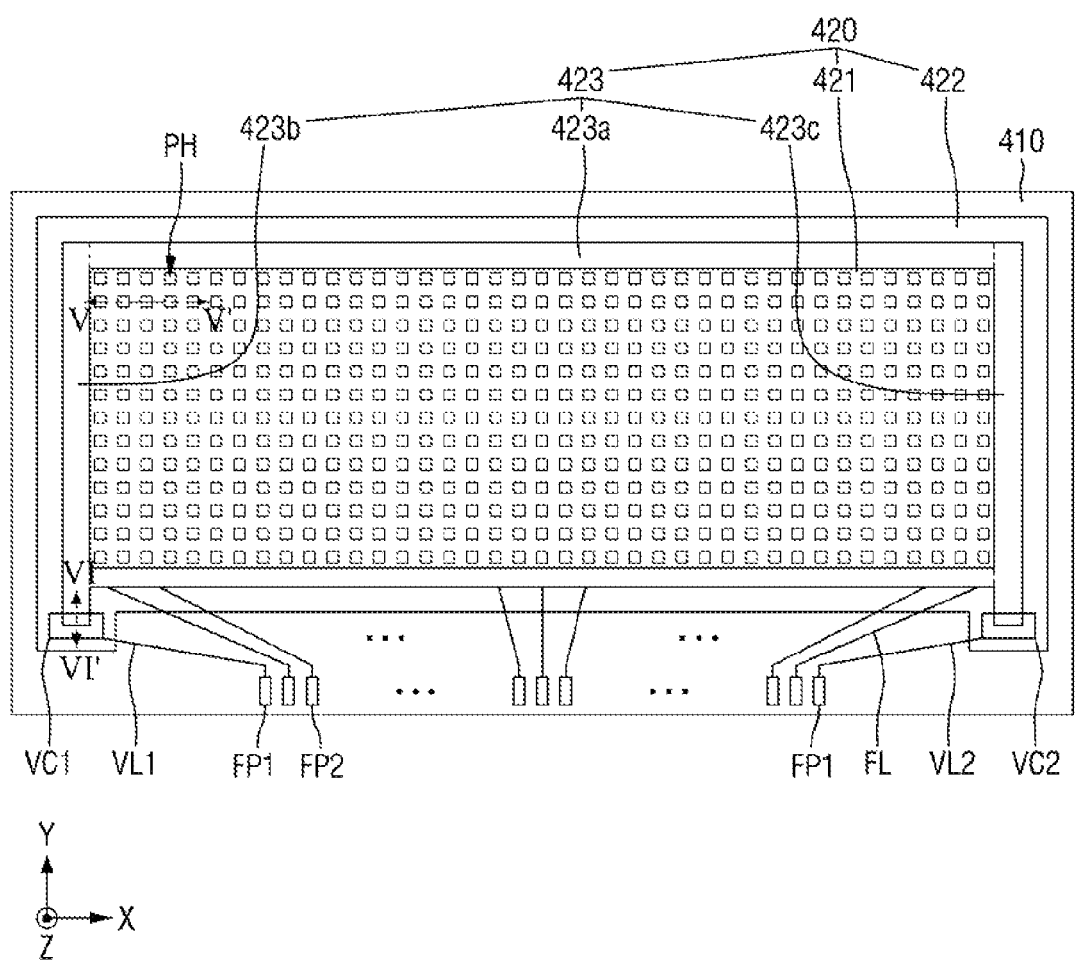
FIG. 12 is a layout view of an example of the fingerprint sensor of FIG. 5.

FIG. 12 is a layout view of an example of the fingerprint sensor 400 of FIG. 5.

The exemplary embodiment of FIG. 12 is different from the exemplary embodiment of FIG. 6 in that an optical layer 420 further includes a transparent conductive layer 423. For convenience of explanation, in describing FIG. 12, differences from the exemplary embodiment of FIG. 6 will be mainly described, and a further description of elements and technical aspects previously described may be omitted Referring to FIG. 12, a light-blocking conductive layer 421 may have a mesh or net structure in a plan view. The light-blocking conductive layer 421 may include holes PH. The light-blocking conductive layer 421 may be disposed on sensor pixels SEP (see FIG. 5) of a sensor area SNA (see FIG. 5). Therefore, the holes PH may overlap the sensor pixels SEP of a light sensing layer 410 in the third direction (Z-axis direction).

The transparent conductive layer 423 may be disposed under the light-blocking conductive layer 421. Thus, the transparent conductive layer 423 may be disposed between the sensor pixels SEP of the light sensing layer 410 and the light-blocking conductive layer 421. The transparent conductive layer 423 may include a first transparent conductive layer 423a, a second transparent conductive layer 423b, and a third transparent conductive layer 423c.

The first transparent conductive layer 423a may have a quadrangular planar shape. The first transparent conductive layer 423a may overlap the light-blocking conductive layer 421 in the third direction (Z-axis direction). In addition, the first transparent conductive layer 423a may overlap the sensor pixels SEP (see FIG. 5) of the sensor area SNA (see FIG. 5) in the third direction (Z-axis direction).

The first transparent conductive layer 423a may be disposed under the light-blocking conductive layer 421. The first transparent conductive layer 423a may contact the light-blocking conductive layer 421. Therefore, the first transparent conductive layer 423a may be electrically connected to the light-blocking conductive layer 421.

The second transparent conductive layer 423b may protrude from a side of the first transparent conductive layer 423a and extend in the second direction (Y-axis direction). A length of the second transparent conductive layer 423b in the second direction (Y-axis direction) may be greater than a length of the first transparent conductive layer 423a in the second direction (Y-axis direction). A side (e.g., a lower side) of the second transparent conductive layer 423b may protrude further than a side (e.g., a lower side) of the first transparent conductive layer 423a in the second direction (Y-axis direction).

The second transparent conductive layer 423b may be disposed on a first conductive connector VC1. For example, the second transparent conductive layer 423b may overlap the first conductive connector VC1 in the thickness direction (Z-axis direction). The second transparent conductive layer 423b may be connected to the first conductive connector VC1 through a conductive adhesive member such as, for example, an anisotropic conductive film. Therefore, the second transparent conductive layer 423b may be electrically connected to the first conductive connector VC1.

The third transparent conductive layer 423c may protrude from the other side of the first transparent conductive layer 423a and extend in the second direction (Y-axis direction). A length of the third transparent conductive layer 423c in the second direction (Y-axis direction) may be greater than the length of the first transparent conductive layer 423a in the second direction (Y-axis direction). A side (e.g., a lower side) of the third transparent conductive layer 423c may protrude further than a side (e.g., the lower side) of the first transparent conductive layer 423a in the second direction (Y-axis direction). In an exemplary embodiment, the length of the third transparent conductive layer 423c may be substantially the same as the length of the second transparent conductive layer 423b in the second direction (Y-axis direction).

The third transparent conductive layer 423c may be disposed on a second conductive connector VC2. For example, the third transparent conductive layer 423c may overlap the second conductive connector VC2 in the thickness direction (Z-axis direction). The third transparent conductive layer 423c may be connected to the second conductive connector VC2 through a conductive adhesive member such as, for example, an anisotropic conductive film. Therefore, the third transparent conductive layer 423c may be electrically connected to the second conductive connector VC2.

A length of the transparent conductive layer 423 in the first direction (X-axis direction) may be greater than a length of the light-blocking conductive layer 421 in the first direction (X-axis direction). However, the present inventive concept is not limited thereto. For example, according to exemplary embodiments, the length of the transparent conductive layer 423 in the first direction (X-axis direction) may be substantially the same as the length of the light-blocking conductive layer 421 in the first direction (X-axis direction). A maximum length of the transparent conductive layer 423 in the second direction (Y-axis direction) may be greater than a maximum length of the light-blocking conductive layer 421 in the second direction (Y-axis direction). However, the present inventive concept is not limited thereto. For example, according to exemplary embodiments, the maximum length of the transparent conductive layer 423 in the second direction (Y-axis direction) may be substantially the same as the maximum length of the light-blocking conductive layer 421 in the second direction (Y-axis direction), or may be smaller than the maximum length of the light-blocking conductive layer 421 in the second direction (Y-axis direction).

As illustrated in FIG. 12, a predetermined voltage may be applied to the second transparent conductive layer 423b via a first fingerprint pad FP1, a first voltage line VL1 and the first conductive connector VC1, and may be applied to the third transparent conductive layer 423c via a first fingerprint pad FP1, a second voltage line VL2 and the second conductive connector VC2. Therefore, since the light-blocking conductive layer 421 can receive the predetermined voltage through the transparent conductive layer 423, scan signals of scan lines SL of a display panel 100 can be prevented or reduced from being coupled to the light-blocking conductive layer 421 by a first parasitic capacitance Cp1. Accordingly, noise due to the scan signals of the scan lines SL of the display panel 100 can be prevented or reduced from adversely affecting sensing signals of sensing lines RL of the light sensing layer 410, which can occur as a result of the first parasitic capacitance Cp1 and a second parasitic capacitance Cp2.

Figure 13:
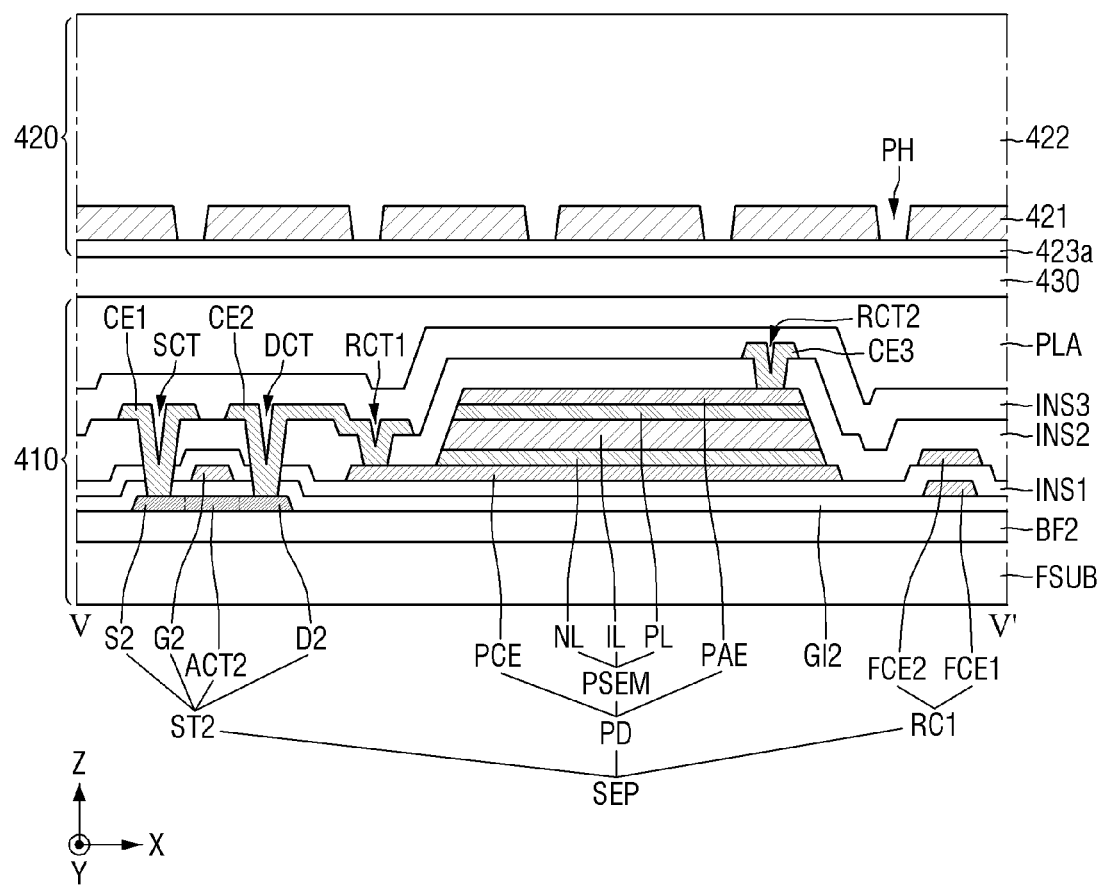
FIG. 13 is a cross-sectional view of an example of the fingerprint sensor taken along line V-V' of FIG. 12.
Figure 14:
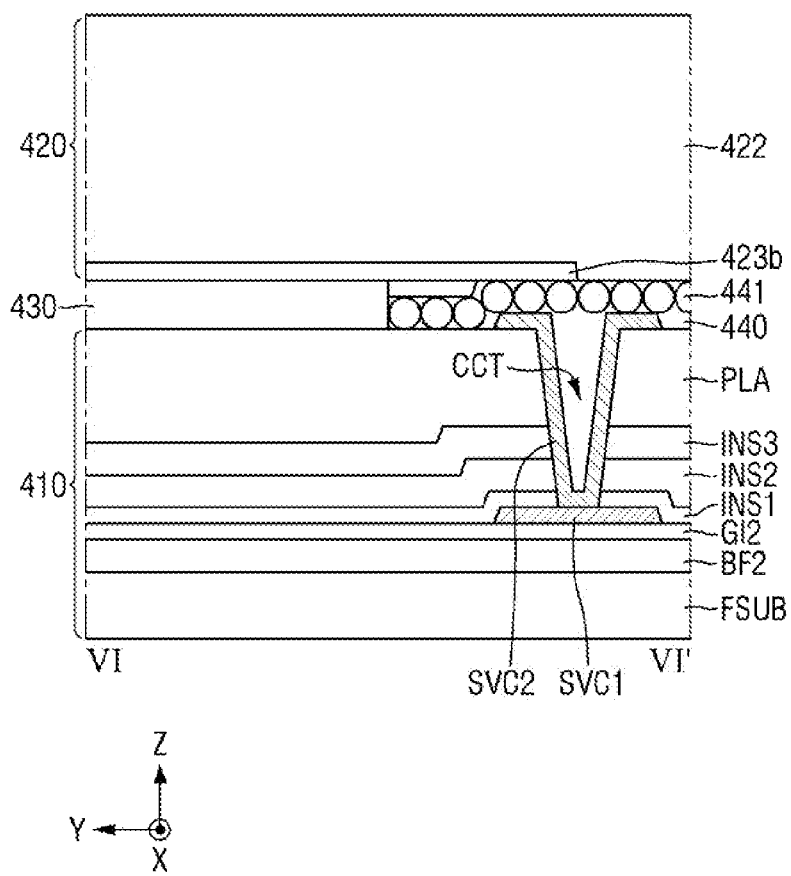
FIG. 14 is a cross-sectional view of an example of the fingerprint sensor taken along line VI-VI' of FIG. 12.

FIG. 13 is a cross-sectional view of an example of the fingerprint sensor taken along line V-V' of FIG. 12. FIG. 14 is a cross-sectional view of an example of the fingerprint sensor taken along line VI-VI' of FIG. 12.

The exemplary embodiment of FIGS. 13 and 14 is different from the exemplary embodiment of FIGS. 7 and 8 in that the first transparent conductive layer 423a is disposed between the light-blocking conductive layer 421 and a planarization layer PLA of the light sensing layer 410, and the second transparent conductive layer 423b is connected to a second sub-conductive connector SVC2 through a conductive adhesive member 440. For convenience of explanation, a further description of elements and technical aspects previously described may be omitted.

Referring to FIGS. 13 and 14, the first transparent conductive layer 423a and the second transparent conductive layer 423b may be disposed on the planarization layer PLA of the light sensing layer 410. The light-blocking conductive layer 421 including the holes PH may be disposed on the first transparent conductive layer 423a. Since the holes PH are filled with a light transmitting layer 422, the first transparent conductive layer 423a may contact the light transmitting layer 422.

The light transmitting layer 422 may be disposed on the second transparent conductive layer 423b. The second transparent conductive layer 423b may contact the light transmitting layer 422.

The conductive adhesive member 440 such as, for example, an anisotropic conductive film, may be disposed between the second sub-conductive connector SVC2 and the second transparent conductive layer 423b. The conductive adhesive member 440 may include conductive balls 441. Therefore, the second sub-conductive connector SVC2 may be electrically connected to the second transparent conductive layer 423b.

As illustrated in FIGS. 13 and 14, the second transparent conductive layer 423b may be connected to the second sub-conductive connector SVC2 through the conductive adhesive member 440. Therefore, a predetermined voltage applied to a first fingerprint pad FP1 (see FIG. 6) may be applied to the light-blocking conductive layer 421 via the first voltage line VL1 (see FIG. 6) connected to the first fingerprint pad FP1 (see FIG. 6), the first conductive connector VC1 and the second transparent conductive layer 423b. Therefore, the scan signals of the scan lines SL of the display panel 100 can be prevented or reduced from being coupled to the light-blocking conductive layer 421 (see FIG. 12) by the first parasitic capacitance Cp1. Accordingly, noise due to the scan signals of the scan lines SL of the display panel 100 can be prevented or reduced from adversely affecting the sensing signals of the sensing lines RL of the light sensing layer 410, which can occur as a result of the first parasitic capacitance Cp1 and the second parasitic capacitance Cp2.

Since the second conductive connector VC2 and the third transparent conductive layer 423c of FIG. 12 can be electrically connected in substantially the same way as the first conductive connector VC1 and the second transparent conductive layer 423b illustrated in FIG. 14, a description of the second conductive connector VC2 and the third transparent conductive layer 423c will be omitted for convenience of description.

Figure 15:
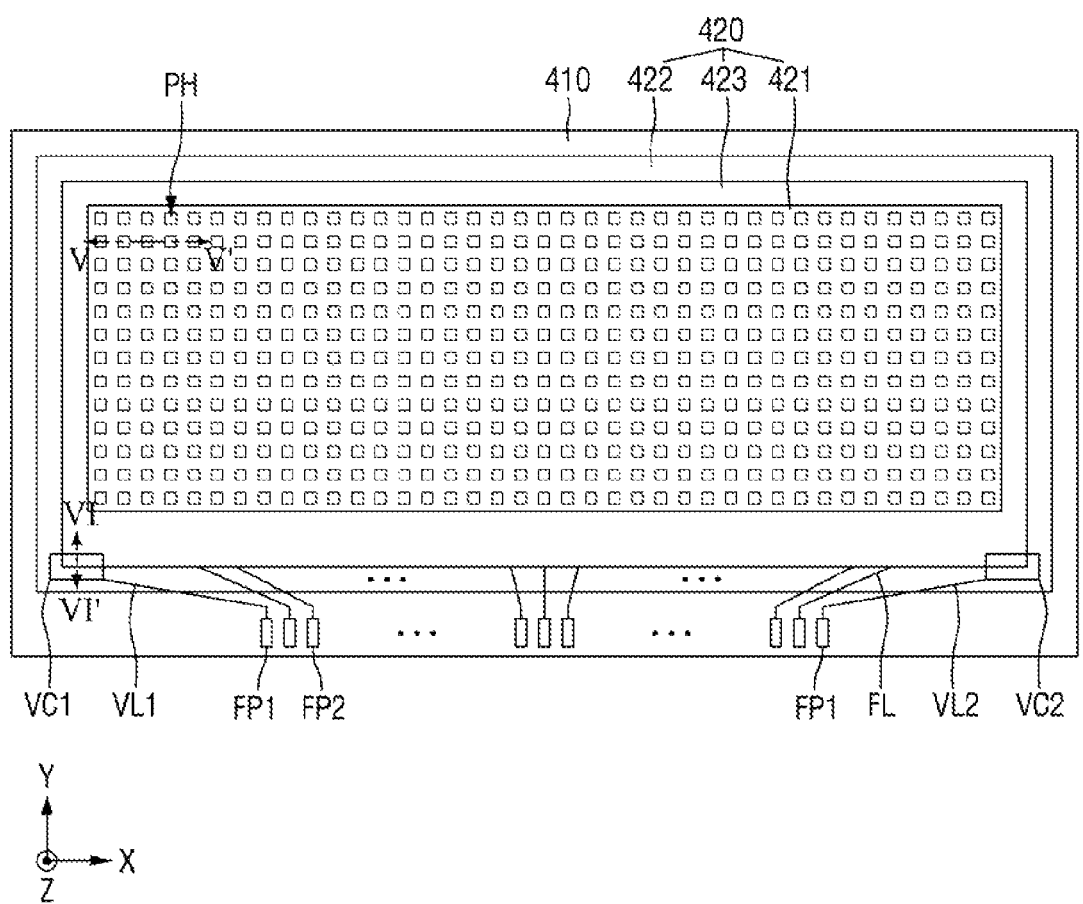
FIG. 15 is a layout view of an example of the fingerprint sensor of FIG. 5.

FIG. 15 is a layout view of an example of the fingerprint sensor 400 of FIG. 5.

The exemplary embodiment of FIG. 15 is only different from the exemplary embodiment of FIG. 12 in that a transparent conductive layer 423 has a quadrangular planar shape and overlaps fan-out lines FL in the thickness direction (Z-axis direction). Thus, for convenience of explanation, a further description of the exemplary embodiment of FIG. 15 will be omitted.

Figure 16:
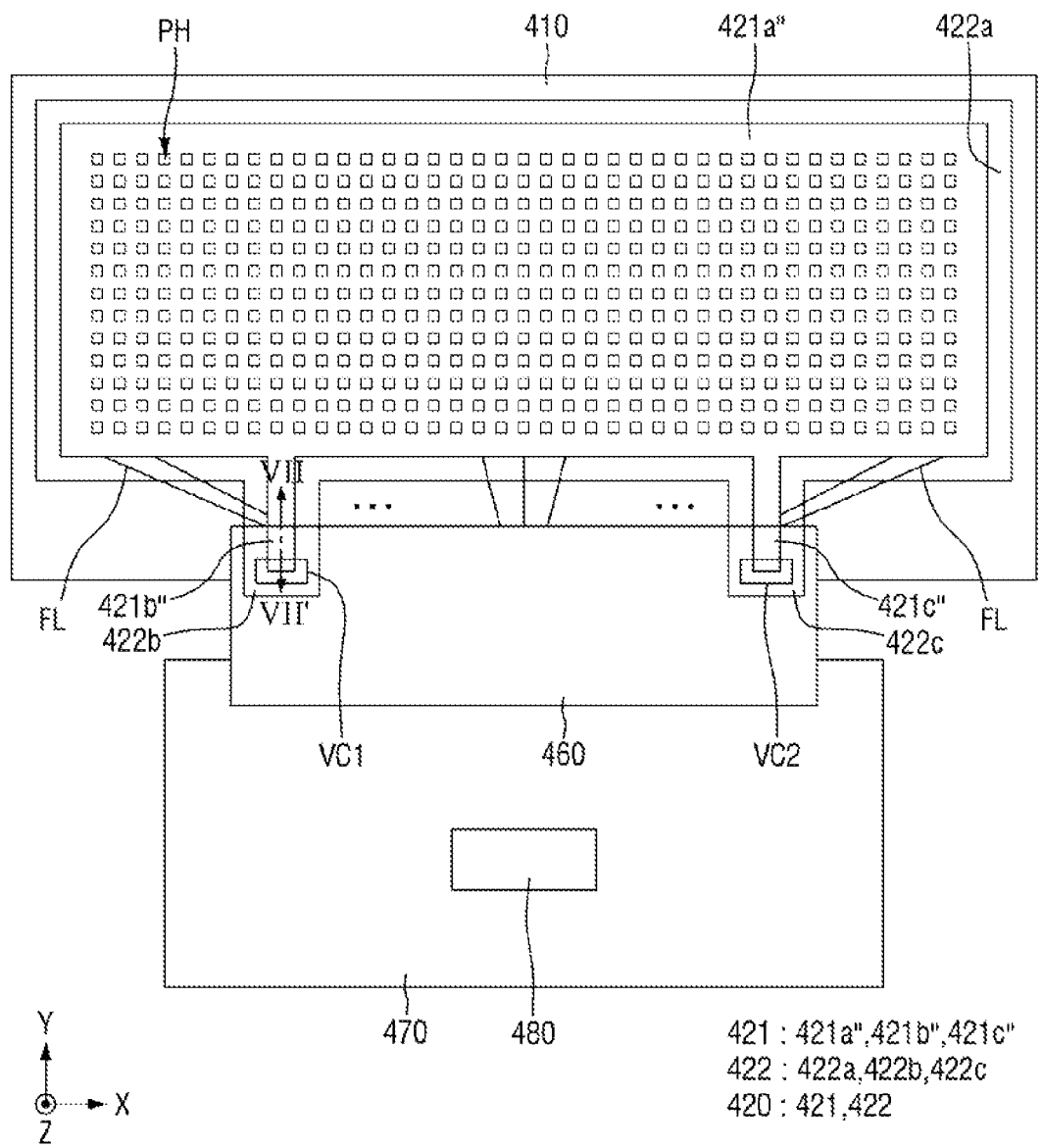
FIG. 16 is a layout view of an example of the fingerprint sensor and a flexible film of FIG. 5.
Figure 17:
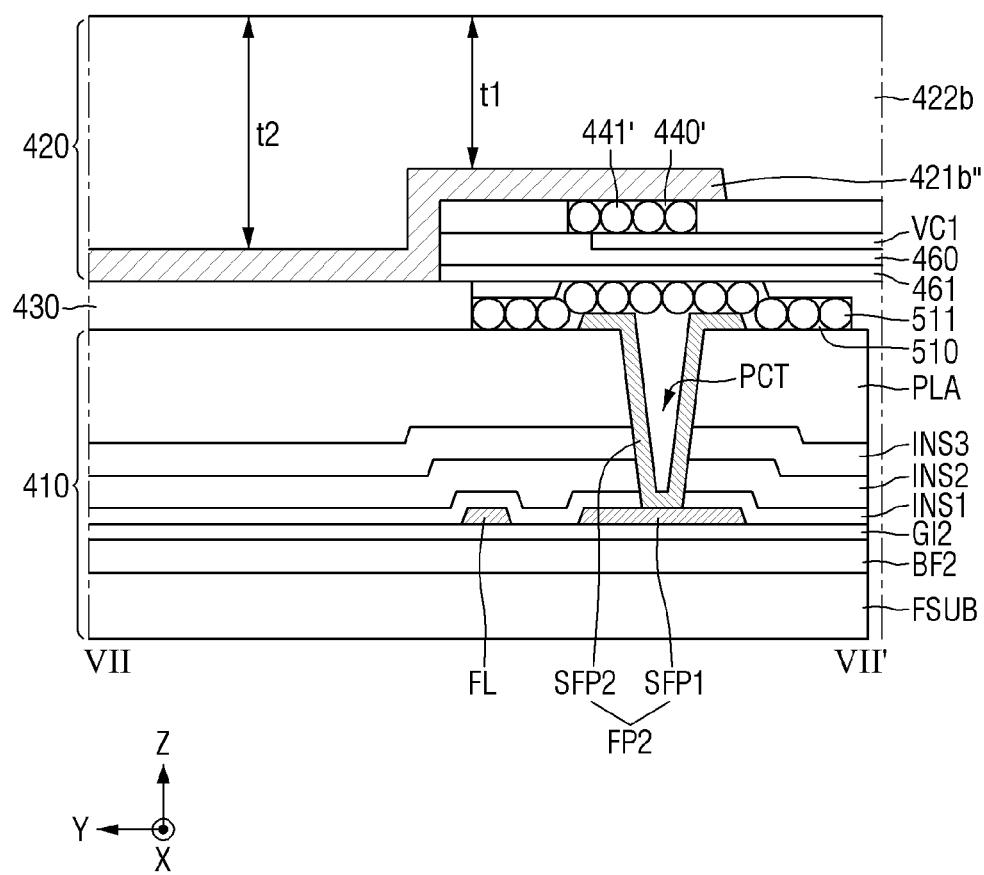
FIG. 17 is a cross-sectional view of an example of the fingerprint sensor and the flexible film taken along line VII-VII' of FIG. 16.

FIG. 16 is a layout view of an example of the fingerprint sensor 400 and the flexible film 460 of FIG. 5. FIG. 17 is a cross-sectional view of an example of the fingerprint sensor 400 and the flexible film 460 taken along line VII-VII' of FIG. 16.

The exemplary embodiment of FIGS. 16 and 17 is different from the exemplary embodiment of FIGS. 6 and 8 in that a first conductive connector VC1 and a second conductive connector VC2 are disposed on a flexible film 460, and not on a light sensing layer 410. For convenience of explanation, in describing FIGS. 16 and 17, differences from the exemplary embodiment of FIGS. 6 and 8 will be mainly described, and a further description of elements and technical aspects previously described may be omitted.

Referring to FIGS. 16 and 17, a second fingerprint pad FP2 includes a first sub-fingerprint pad SFP1 and a second sub-fingerprint pad SFP2.

The first sub-fingerprint pad SFP1 and a fan-out line FL may be disposed on a second gate insulating layer GI2. The first sub-fingerprint pad SFP1 and the fan-out line FL may be disposed on the same layer and made of the same material as a second gate electrode G2 of a second thin-film transistor ST2, a first fingerprint capacitor electrode FCE1, and a first sub-conductive connector SVC1 of the first conductive connector VC1. Each of the first sub-fingerprint pad SFP1 and the fan-out line FL may be a single layer or a multilayer made of any one or more of, for example, molybdenum (Mo), aluminum (Al), chromium (Cr), gold (Au), titanium (Ti), nickel (Ni), neodymium (Nd), copper (Cu), and alloys of the same.

The second sub-fingerprint pad SFP2 may be disposed on a planarization layer PLA. The second sub-fingerprint pad SFP2 may be connected to the first sub-fingerprint pad SFP1 through a pad contact hole PCT penetrating a first insulating layer INS1, a second insulating layer INS2, a third insulating layer INS3, and the planarization layer PLA.

In FIG. 17, the first sub-fingerprint pad SFP1 is disposed on the second gate insulating layer GI2, and the second sub-fingerprint pad SFP2 is disposed on the planarization layer PLA. However, the present inventive concept is not limited thereto. For example, according to exemplary embodiments, the first sub-fingerprint pad SFP1 may be disposed on the first insulating layer INS1, and the second sub-fingerprint pad SFP2 may be disposed on the second insulating layer INS2.

A conductive adhesive member 510 such as, for example, an anisotropic conductive film, may be disposed between the second sub-fingerprint pad SFP2 and a conductive line 461 or a conductive pad disposed on a lower surface of the flexible film 460. The conductive adhesive member 510 may include conductive balls 511. Therefore, the second sub-fingerprint pad SFP2 may be electrically connected to the conductive line 461 or the conductive pad of the flexible film 460.

The second sub-fingerprint pad SFP2 may also be disposed on the second insulating layer INS2. In this case, the second sub-fingerprint pad SFP2 may be exposed without being covered by the planarization layer PLA. In this case, the conductive adhesive member 510 disposed on the second sub-fingerprint pad SFP2 may be thicker than the planarization layer PLA.

A light-blocking conductive layer 421 may include a first light-blocking conductive layer 421a", a second light-blocking conductive layer 421b", and a third light-blocking conductive layer 421c". The first light-blocking conductive layer 421a", the second light-blocking conductive layer 421b", and the third light-blocking conductive layer 421c" may include a metal material that does not transmit light or has low light transmittance. For example, each of the first light-blocking conductive layer 421a", the second light-blocking conductive layer 421b", and the third light-blocking conductive layer 421c" may be a single layer or a multilayer made of any one or more of, for example, molybdenum (Mo), aluminum (Al), chromium (Cr), gold (Au), titanium (Ti), nickel (Ni), neodymium (Nd), copper (Cu), and alloys of the same. The first light-blocking conductive layer 421a", the second light-blocking conductive layer 421b", and the third light-blocking conductive layer 421c" may be made of the same material.

The first light-blocking conductive layer 421a" may have a mesh or net structure in a plan view. The first light-blocking conductive layer 421a" may include holes PH. The first light-blocking conductive layer 421a" may be disposed on sensor pixels SEP (see FIG. 5) of a sensor area SNA (see FIG. 5). Therefore, the holes PH may overlap the sensor pixels SEP of the light sensing layer 410 in the third direction (Z-axis direction).

The second light-blocking conductive layer 421b" may protrude from a side of the first light-blocking conductive layer 421a" and extend in the second direction (Y-axis direction). The second light-blocking conductive layer 421b" may be disposed on the first conductive connector VC1 disposed on an upper surface of the flexible film 460. The second light-blocking conductive layer 421b" may be connected to the first conductive connector VC1 through a conductive adhesive member 440' such as, for example, an anisotropic conductive film. The conductive adhesive member 440' may include conductive balls 441'. Therefore, the second light-blocking conductive layer 421b" may be electrically connected to the first conductive connector VC1.

The third light-blocking conductive layer 421c" may protrude from the side of the first light-blocking conductive layer 421a" and extend in the second direction (Y-axis direction). The third light-blocking conductive layer 421c" may be disposed on the second conductive connector VC2 disposed on the upper surface of the flexible film 460. The third light-blocking conductive layer 421c" may be connected to the second conductive connector VC2 through a conductive adhesive member such as, for example, an anisotropic conductive film. Therefore, the third light-blocking conductive layer 421c" may be electrically connected to the second conductive connector VC2.

The first conductive connector VC1 and the second conductive connector VC2 of the flexible film 460 may be connected to a ground source of the flexible film 460 or a sensor circuit board 470. Alternatively, the first conductive connector VC1 and the second conductive connector VC2 of the flexible film 460 may be connected to a sensor driving circuit 480. In this case, a first sensing driving voltage applied to a first sensing driving voltage line RVSSL (see FIG. 4B) or a second sensing driving voltage applied to a second sensing driving voltage line RVDDL (see FIG. 4B) may be applied from the sensor driving circuit 480 to the first conductive connector VC1 and the second conductive connector VC2 of the flexible film 460.

A light transmitting layer 422 may include a first light transmitting layer 422a, a second light transmitting layer 422b, and a third light transmitting layer 422c. The second light transmitting layer 422b and the third light transmitting layer 422c may extend from a side (e.g., a lower side) of the first light transmitting layer 422a. Due to the flexible film 460 and the conductive adhesive members 440' and 510, a thickness t1 of a portion of the second light transmitting layer 422b overlapping the flexible film 460 in the third direction (Z-axis direction) may be smaller than a thickness t2 of a portion of the second light transmitting layer 422b not overlapping the flexible film 460 in the third direction (Z-axis direction). In addition, due to the flexible film 460 and the conductive adhesive members 440' and 510, the thickness t1 of the portion of the second light transmitting layer 422b overlapping the flexible film 460 in the third direction (Z-axis direction) may be smaller than a thickness of a portion of the first light transmitting layer 422a overlapping the sensor pixels SEP in the third direction (Z-axis direction).

As illustrated in FIGS. 16 and 17, the second light-blocking conductive layer 421b" may be connected to the first conductive connector VC1 on the upper surface of the flexible film 460 through the conductive adhesive member 440'. Thus, a predetermined voltage may be applied to the first light-blocking conductive layer 421a" and the second light-blocking conductive layer 421b" via the first conductive connector VC1 and the conductive adhesive member 440'. Therefore, scan signals of scan lines SL of a display panel 100 can be prevented or reduced from being coupled to the light-blocking conductive layer 421 by a first parasitic capacitance Cp1. Accordingly, noise due to the scan signals of the scan lines SL of the display panel 100 can be prevented or reduced from adversely affecting sensing signals of sensing lines RL of the light sensing layer 410, which can occur as a result of the first parasitic capacitance Cp1 and a second parasitic capacitance Cp2.

Figure 18:
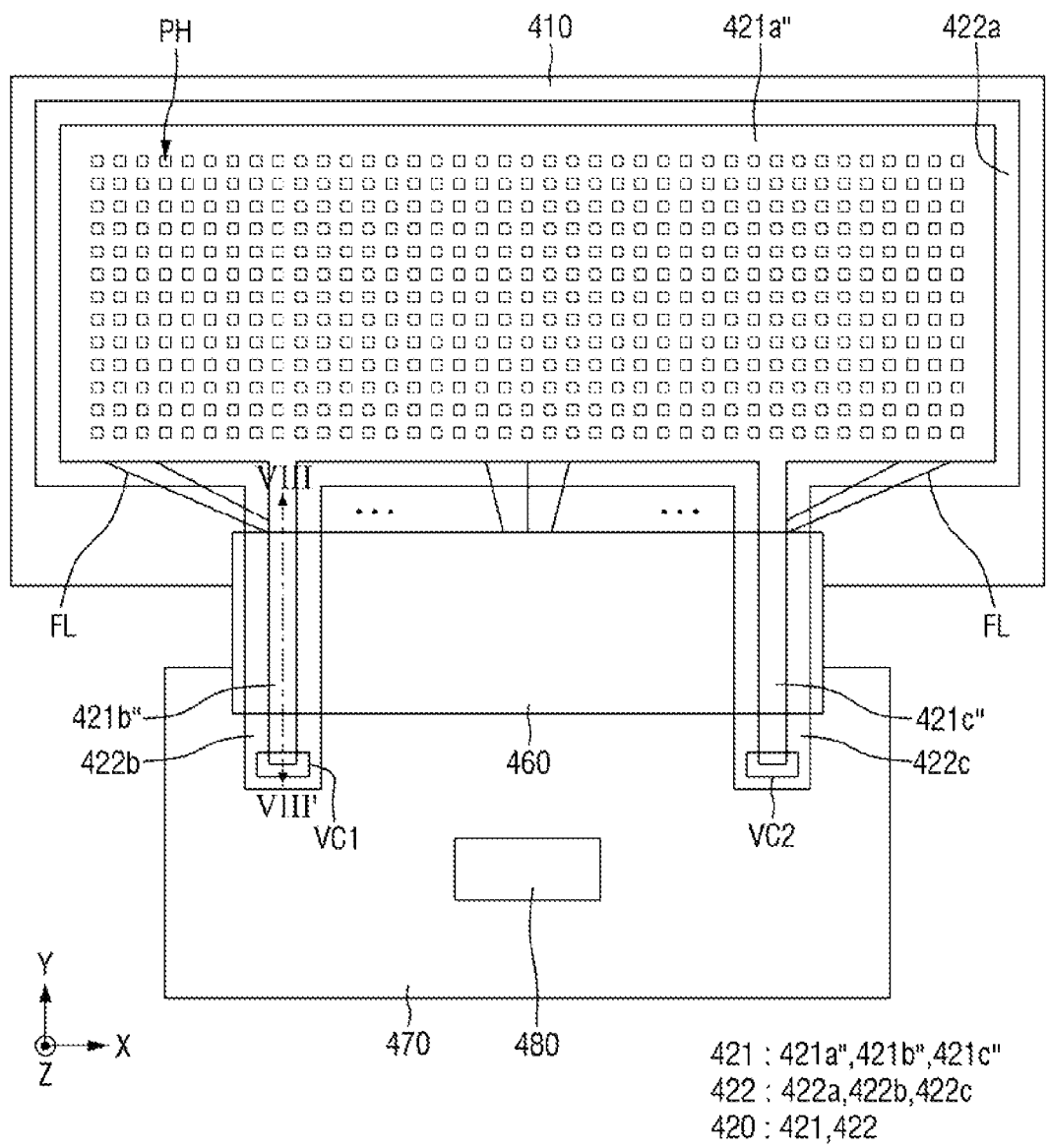
FIG. 18 is a layout view of an example of the fingerprint sensor, the flexible film, and a sensor circuit board of FIG. 5.
Figure 19:
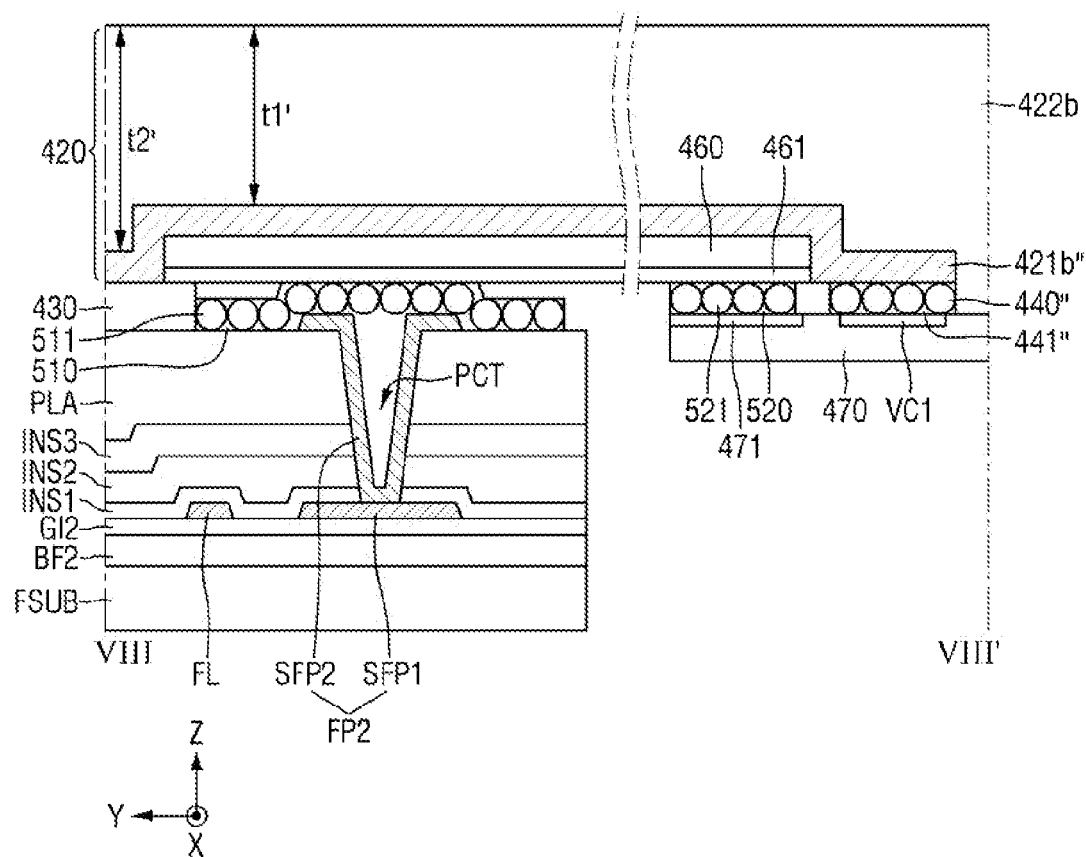
FIG. 19 is a cross-sectional view of an example of the fingerprint sensor, the flexible film, and the sensor circuit board taken along line VIII-VIII' of FIG. 18.

FIG. 18 is a layout view of an example of the fingerprint sensor 400, the flexible film 460, and the sensor circuit board 470 of FIG. 5. FIG. 19 is a cross-sectional view of an example of the fingerprint sensor 400, the flexible film 460, and the sensor circuit board 470 taken along line VIII-VIII' of FIG. 18.

The exemplary embodiment of FIGS. 18 and 19 is different from the exemplary embodiment of FIGS. 6 and 8 in that a first conductive connector VC1 and a second conductive connector VC2 are disposed on a flexible film 460, and not on a light sensing layer 410. For convenience of explanation, in describing FIGS. 18 and 19, differences from the exemplary embodiment of FIGS. 6 and 8 will be mainly described, and a further description of elements and technical aspects previously described may be omitted.

Referring to FIGS. 18 and 19, a second fingerprint pad FP2 includes a first sub-fingerprint pad SFP1 and a second sub-fingerprint pad SFP2. The first sub-fingerprint pad SFP1 and the second sub-fingerprint pad SFP2 are substantially the same as those described above with reference to FIGS. 16 and 17, and thus, a further description of the first sub-fingerprint pad SFP1 and the second sub-fingerprint pad SFP2 will be omitted for convenience of description.

A conductive adhesive member 510 such as, for example, an anisotropic conductive film, may be disposed between the second sub-fingerprint pad SFP2 and a conductive line 461 or a conductive pad disposed on a lower surface of the flexible film 460. The conductive adhesive member 510 may include conductive balls 511. Therefore, the second sub-fingerprint pad SFP2 may be electrically connected to the conductive line 461 or the conductive pad of the flexible film 460.

A conductive adhesive member 520 such as, for example, an anisotropic conductive film, may be disposed between a conductive line 471 or a conductive pad of a sensor circuit board 470 and the conductive line 461 or the conductive pad disposed on the lower surface of the flexible film 460. The conductive adhesive member 520 may include conductive balls 521. Therefore, the conductive line 471 or the conductive pad of the sensor circuit board 470 may be electrically connected to the conductive line 461 or the conductive pad of the flexible film 460.

A light-blocking conductive layer 421 may include a first light-blocking conductive layer 421a", a second light-blocking conductive layer 421b", and a third light-blocking conductive layer 421c". The first light-blocking conductive layer 421a", the second light-blocking conductive layer 421b", and the third light-blocking conductive layer 421c" may include a metal material that does not transmit light or has low light transmittance. For example, each of the first light-blocking conductive layer 421a", the second light-blocking conductive layer 421b", and the third light-blocking conductive layer 421c" may be a single layer or a multilayer made of any one or more of, for example, molybdenum (Mo), aluminum (Al), chromium (Cr), gold (Au), titanium (Ti), nickel (Ni), neodymium (Nd), copper (Cu), and alloys of the same. The first light-blocking conductive layer 421a", the second light-blocking conductive layer 421b", and the third light-blocking conductive layer 421c" may be made of the same material.

The first light-blocking conductive layer 421a" may have a mesh or net structure in a plan view. The first light-blocking conductive layer 421a" may include holes PH. The first light-blocking conductive layer 421a" may be disposed on sensor pixels SEP (see FIG. 5) of a sensor area SNA (see FIG. 5). Therefore, the holes PH may overlap the sensor pixels SEP of the light sensing layer 410 in the third direction (Z-axis direction).

The second light-blocking conductive layer 421b" may protrude from a side (e.g., a lower side) of the first light-blocking conductive layer 421a" and extend in the second direction (Y-axis direction). The second light-blocking conductive layer 421b" may be disposed on the flexible film 460 and the sensor circuit board 470. The second light-blocking conductive layer 421b" may be disposed on the first conductive connector VC1 disposed on an upper surface of the sensor circuit board 470. The second light-blocking conductive layer 421b" may be connected to the first conductive connector VC1 through a conductive adhesive member 440"

such as, for example, an anisotropic conductive film. The conductive adhesive member 440" may include conductive balls 441". Therefore, the second light-blocking conductive layer 421b" may be electrically connected to the first conductive connector VC1.

The third light-blocking conductive layer 421c" may protrude from the side (e.g., the lower side) of the first light-blocking conductive layer 421a" and extend in the second direction (Y-axis direction). The third light-blocking conductive layer 421c" may be disposed on the flexible film 460 and the sensor circuit board 470. The third light-blocking conductive layer 421c" may be disposed on the second conductive connector VC2 disposed on the upper surface of the sensor circuit board 470. The third light-blocking conductive layer 421c" may be connected to the second conductive connector VC2 through a conductive adhesive member such as, for example, an anisotropic conductive film. Therefore, the third light-blocking conductive layer 421c" may be electrically connected to the second conductive connector VC2.

The first conductive connector VC1 and the second conductive connector VC2 of the sensor circuit board 470 may be connected to a ground source of the sensor circuit board 470. Alternatively, the first conductive connector VC1 and the second conductive connector VC2 of the sensor circuit board 470 may be connected to a sensor driving circuit 480. In this case, a first sensing driving voltage applied to a first sensing driving voltage line RVSSL (see FIG. 4B) or a second sensing driving voltage applied to a second sensing driving voltage line RVDDL (see FIG. 4B) may be applied from the sensor driving circuit 480 to the first conductive connector VC1 and the second conductive connector VC2 of the sensor circuit board 470.

A light transmitting layer 422 may include a first light transmitting layer 422a, a second light transmitting layer 422b, and a third light transmitting layer 422c. The second light transmitting layer 422b and the third light transmitting layer 422c may extend from a side (e.g., a lower side) of the first light transmitting layer 422a. Due to the flexible film 460 and the conductive adhesive member 510, a thickness t1' of a portion of the second light transmitting layer 422b overlapping the flexible film 460 in the third direction (Z-axis direction) may be smaller than a thickness t2' of a portion of the second light transmitting layer 422b not overlapping the flexible film 460 in the third direction (Z-axis direction). The thickness t1' of the portion of the second light transmitting layer 422b overlapping the flexible film 460 in the third direction (Z-axis direction) may be smaller than a thickness of a portion of the first light transmitting layer 422a overlapping the sensor pixels SEP in the third direction (Z-axis direction).

As illustrated in FIGS. 18 and 19, the second light-blocking conductive layer 421b" may be connected to the first conductive connector VC1 on the upper surface of the sensor circuit board 470 through the conductive adhesive member 440". Thus, a predetermined voltage may be applied to the first light-blocking conductive layer 421a" and the second light-blocking conductive layer 421b" via the first conductive connector VC1 and the conductive adhesive member 440". Therefore, scan signals of scan lines SL of a display panel 100 can be prevented or reduced from being coupled to the light-blocking conductive layer 421 by a first parasitic capacitance Cp1. Accordingly, noise due to the scan signals of the scan lines SL of the display panel 100 can be prevented or reduced from adversely affecting sensing signals of sensing lines RL of the light sensing layer 410, which can occur as a result of the first parasitic capacitance Cp1 and a second parasitic capacitance Cp2.

Figure 20:
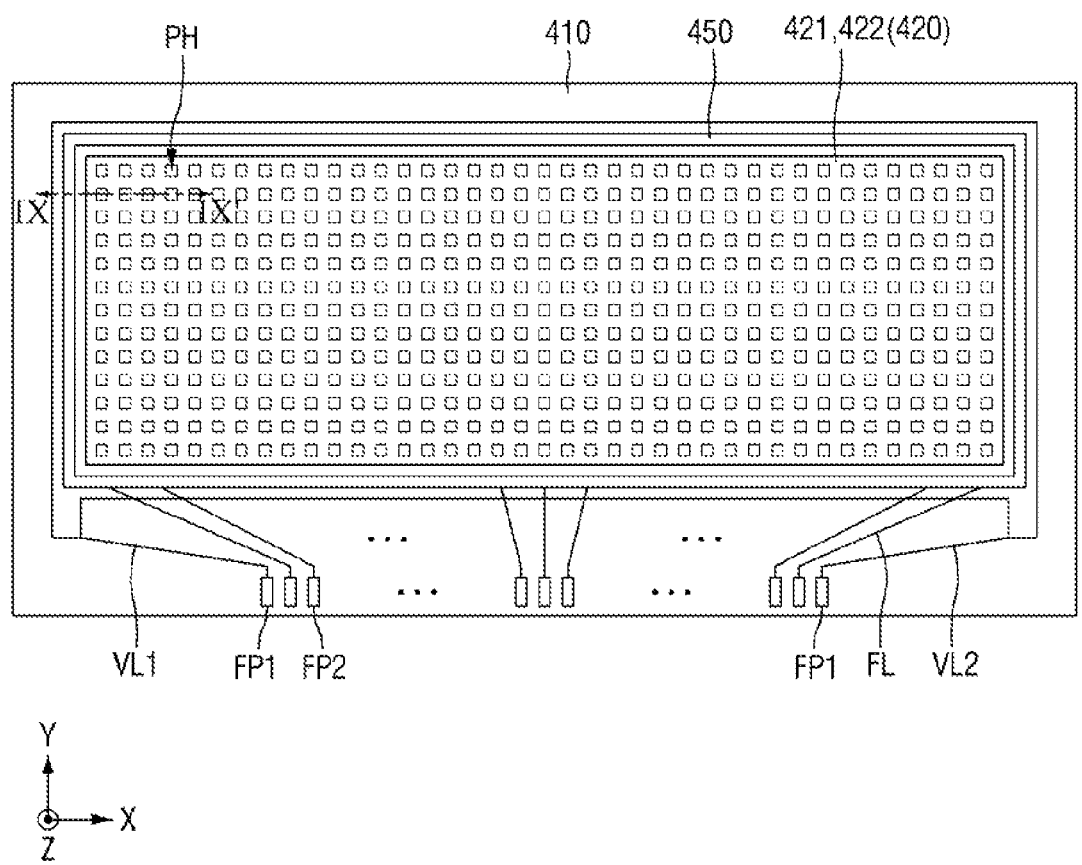
FIG. 20 is a layout view of an example of the fingerprint sensor of FIG. 5.
Figure 21:
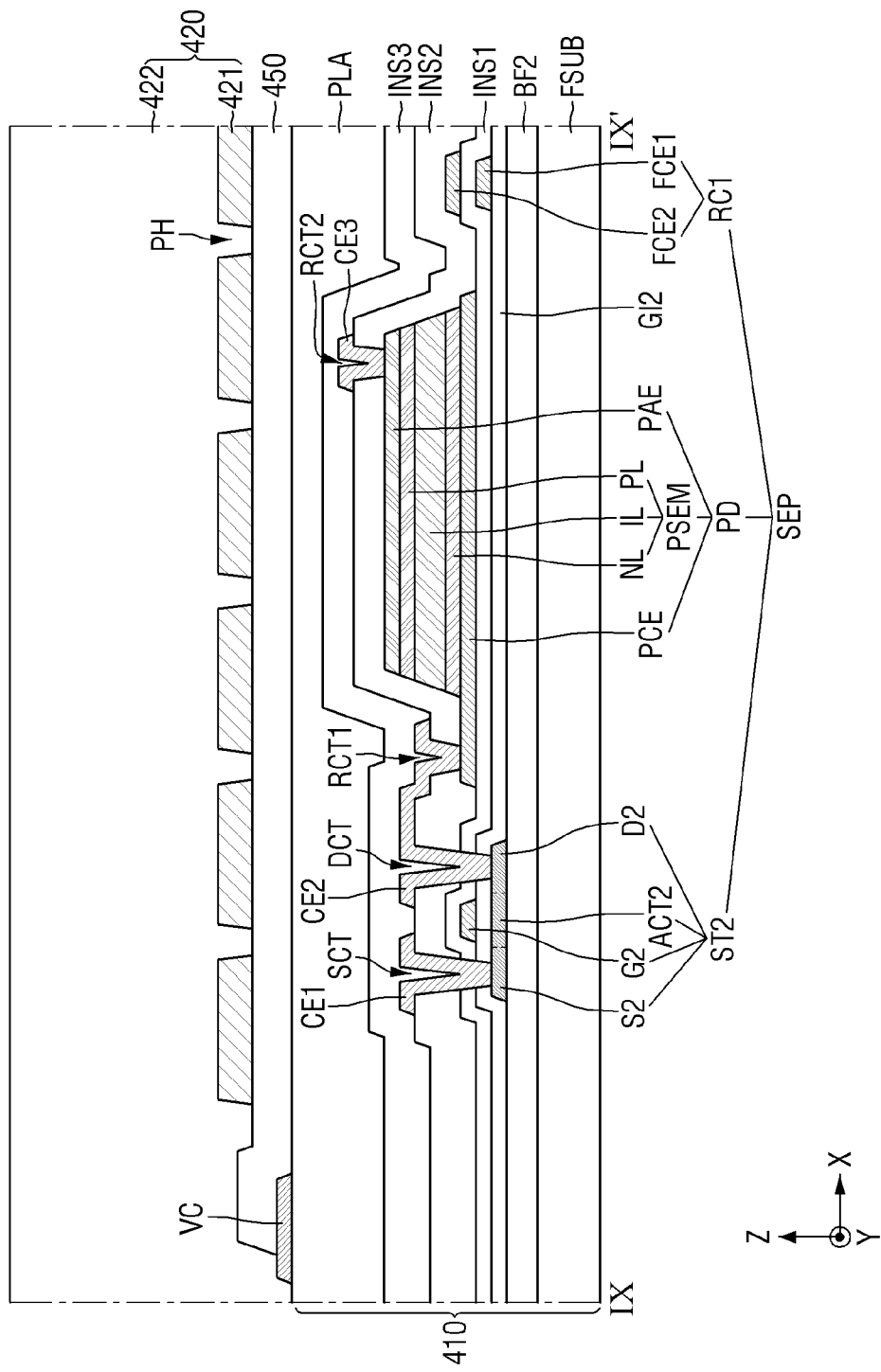
FIG. 21 is a cross-sectional view of an example of the fingerprint sensor taken along line IX-IX' of FIG. 20.

FIG. 20 is a layout view of an example of the fingerprint sensor 400 of FIG. 5. FIG. 21 is a cross-sectional view of an example of the fingerprint sensor 400 taken along line IX-IX' of FIG. 20.

The exemplary embodiment of FIGS. 20 and 21 is different from the exemplary embodiment of FIGS. 6 and 7 in that a fingerprint sensor 400 further includes a conductive adhesive member 450 between a light sensing layer 410 and an optical layer 420. For convenience of explanation, in describing FIGS. 20 and 21, differences from the exemplary embodiment of FIGS. 6 and 7 will be mainly described, and a further description of elements and technical aspects previously described may be omitted.

Referring to FIGS. 20 and 21, a light-blocking conductive layer 421 and a light transmitting layer 422 may be disposed on sensor pixels SEP (see FIG. 5) of a sensor area SNA (see FIG. 5) of the light sensing layer 410. Therefore, holes PH may overlap the sensor pixels SEP of the light sensing layer 410 in the third direction (Z-axis direction).

A conductive connector VC may be connected to a first voltage line VL1 on a side (e.g., a left side) and may be connected to a second voltage line VL2 on the other side (e.g., a right side). The conductive connector VC may surround the light-blocking conductive layer 421 and the light transmitting layer 422. The conductive connector VC may be shaped as a quadrangular frame or a quadrangular window frame in a plan view.

The conductive adhesive member 450 may be disposed between the light-blocking conductive layer 421 and a planarization layer PLA of the light sensing layer 410. The conductive adhesive member 450 may include conductive balls. The conductive adhesive member 450 may be disposed on the conductive connector VC. The light-blocking conductive layer 421 may be electrically connected to the conductive connector VC through the conductive adhesive member 450.

Although the conductive connector VC does not overlap the light-blocking conductive layer 421 in the third direction (Z-axis direction), the present inventive concept is not limited thereto. For example, according to exemplary embodiments, the conductive connector VC may overlap the light-blocking conductive layer 421 in the third direction (Z-axis direction).

As illustrated in FIGS. 20 and 21, the light-blocking conductive layer 421 may be connected to the conductive connector VC through the conductive adhesive member 450. Thus, a predetermined voltage may be applied to the light-blocking conductive layer 421 via a first fingerprint pad FP1, the first voltage line VL1, and the conductive connector VC. Therefore, scan signals of scan lines SL of a display panel 100 can be prevented or reduced from being coupled to the light-blocking conductive layer 421 by a first parasitic capacitance Cp1. Accordingly, noise due to the scan signals of the scan lines SL of the display panel 100 can be prevented or reduced from adversely affecting sensing signals of sensing lines RL of the light sensing layer 410, which can occur as a result of the first parasitic capacitance Cp1 and a second parasitic capacitance Cp2.

According to an exemplary embodiment of the present inventive concept, a display device 10 may include a light sensing layer 410, a display panel 100, and a light-blocking conductive layer 421. The light sensing layer 410 may include a plurality of sensor pixels SEP, a first first fingerprint pad FP1, a second first fingerprint pad FP1, a first conductive connector VC1, and a second conductive connector VC2. Each sensor pixel SEP may include a light sensing element PD through which a sensing current flows according to an amount of an incident light. The display panel 100 may include a plurality of scan lines SL, and the light-blocking conductive layer 421 may include a plurality of holes PH and may be disposed between the light sensing layer 410 and the display panel 100. The first first fingerprint pad FP1 may be connected to the first conductive connector VC1 via a first voltage line VL1, and the second first fingerprint pad FP1 may be connected to the second conductive connector VC2 via a second voltage line VL2. A predetermined voltage may be transmitted from the first first fingerprint pad FP1, the first voltage line VL1, and the first conductive connector VC1 to the light-blocking conductive layer 421, and the predetermined voltage may be transmitted from the second first fingerprint pad FP1, the second voltage line VL2, and the second conductive connector VC2 to the light-blocking conductive layer 421.

In a fingerprint sensor and a display device including the same according to an exemplary embodiment of the present inventive concept, a predetermined voltage may be applied to a light-blocking conductive layer via a fingerprint pad, a voltage line and a conductive connector of the fingerprint sensor. Therefore, scan signals of scan lines of a display panel can be prevented or reduced from being coupled to the light-blocking conductive layer by a first parasitic capacitance formed between the scan lines and the light-blocking conductive layer. Accordingly, noise due to the scan signals of the scan lines of the display panel can be prevented or reduced from adversely affecting sensing signals of sensing lines of the fingerprint sensor, which may occur as a result of the first parasitic capacitance and a second parasitic capacitance formed between the light-blocking conductive layer and the sensing lines of the fingerprint sensor.

In a fingerprint sensor and a display device including the same according to an exemplary embodiment of the present inventive concept, since a light-blocking conductive layer is connected to a conductive connector of a flexible film or a circuit board through a conductive adhesive member, a predetermined voltage may be applied to the light-blocking conductive layer. Therefore, scan signals of scan lines of a display panel can be prevented or reduced from being coupled to the light-blocking conductive layer by a first parasitic capacitance formed between the scan lines and the light-blocking conductive layer. Accordingly, noise due to the scan signals of the scan lines of the display panel can be prevented or reduced from adversely affecting sensing signals of sensing lines of the fingerprint sensor, which can occur as a result of the first parasitic capacitance and a second parasitic capacitance formed between the light-blocking conductive layer and the sensing lines of the fingerprint sensor.

While the present inventive concept has been particularly shown and described with reference to the exemplary embodiments thereof, it will be understood by those of ordinary skill in the art that various changes in form and detail may be made thereto without departing from the spirit and scope of the present inventive concept as set forth in the following claims.

What is claimed is:
1. A fingerprint sensor, comprising:
   a substrate;
   a light sensing element through which a sensing current flows according to an amount of an incident light;
   a light-blocking conductive layer disposed on the light sensing element and comprising a plurality of holes; and
   a conductive layer which is disposed between the substrate and the light-blocking conductive layer, contacts the light-blocking conductive layer, and overlaps the plurality of holes in a plan view,
   wherein a voltage is configured to be applied to the conductive layer.

2. The fingerprint sensor of claim 1, wherein the conductive layer is in contact with the light-blocking conductive layer.

3. The fingerprint sensor of claim 1, wherein the conductive layer is disposed between the light sensing element and the light-blocking conductive layer.

4. The fingerprint sensor of claim 1, further comprising:
   a first fingerprint pad disposed on the substrate, and connected to a voltage line, wherein the voltage is configured to be applied to the voltage line;
   a second fingerprint pad disposed on the substrate; and
   a fan-out line connected to the second fingerprint pad.

5. The fingerprint sensor of claim 4, wherein a hole of the plurality of holes overlaps the fan-out line in a thickness direction of the substrate.

6. The fingerprint sensor of claim 4, wherein the conductive layer overlaps the fan-out line in a thickness direction of the substrate.

7. The fingerprint sensor of claim 4, further comprising:
   a flexible film disposed on the first and second fingerprint pads; and
   a sensor circuit board electrically connected to the flexible film.

8. The fingerprint sensor of claim 1, further comprising:
   a first sensing driving voltage line electrically connected to a first electrode of the light sensing element and to which a first sensing driving voltage is applied; and
   a transistor connected between a second electrode of the light sensing element and a second sensing driving voltage line to which a second sensing driving voltage is applied.

9. The fingerprint sensor of claim 8, wherein the voltage is a ground voltage, the first sensing driving voltage, or the second sensing driving voltage.

10. The fingerprint sensor of claim 1, further comprising:
    a transparent adhesive member disposed between the light sensing element and the conductive layer.

11. The fingerprint sensor of claim 10, wherein the transparent adhesive member is in contact with the conductive layer.

12. The fingerprint sensor of claim 1, wherein the conductive layer is a transparent layer.

13. A fingerprint sensor of claim 1, comprising:
    a substrate;
    a light sensing element through which a sensing current flows according to an amount of an incident light;
    a light-blocking conductive layer disposed on the light sensing element and comprising a plurality of holes; and
    a conductive layer which overlaps the plurality of holes in a plan view,
    wherein a voltage is configured to be applied to the conductive layer,
    wherein the conductive layer comprises:
    a first conductive layer which overlaps the plurality of holes in a thickness direction of the substrate; and
    a second conductive layer extending from the first conductive layer,
    wherein the second conductive layer does not overlap the plurality of holes in the thickness direction of the substrate.

14. The fingerprint sensor of claim 13, further comprising:
a conductive connector comprises a first conductive connector, and a second conductive connector connected to the first conductive connector through a connection contact hole penetrating at least one insulating film.

15. The fingerprint sensor of claim 14, wherein the conductive connector does not overlap the light-blocking conductive layer in a thickness direction of the substrate.

16. The fingerprint sensor of claim 14, wherein the conductive connector does not overlap the plurality of holes in a thickness direction of the substrate.

17. The fingerprint sensor of claim 14, further comprising:
a conductive adhesive member between the second conductive layer and the second conductive connector.

18. The fingerprint sensor of claim 14, further comprising:
a voltage line to which the voltage is applied, and
wherein the first conductive connector is connected to the voltage line.

19. The fingerprint sensor of claim 18, wherein the voltage line and the first conductive connector are disposed on a same layer, and the voltage line and the first conductive connector include a same material.

20. A display device, comprising:
a display panel which displays an image; and
a fingerprint sensor which is disposed on a surface of the display panel and senses a light passing through the display panel,
wherein the fingerprint sensor comprises:
a substrate;
a light sensing element through which a sensing current flows according to an amount of an incident light;
a light-blocking conductive layer disposed on the light sensing element and comprising a plurality of holes; and
a conductive layer which is disposed between the substrate and the light-blocking conductive layer, contacts the light-blocking conductive layer, and overlaps the plurality of holes in a plan view,
wherein a voltage is configured to be applied to the conductive layer.

* * * * *